United States Patent [19]
Tokura et al.

[11] Patent Number: 5,780,324
[45] Date of Patent: *Jul. 14, 1998

[54] METHOD OF MANUFACTURING A VERTICAL SEMICONDUCTOR DEVICE

[75] Inventors: Norihito Tokura; Shigeki Takahashi, both of Okazaki; Tsuyoshi Yamamoto; Mitsuhiro Kataoka, both of Kariya; Kunihiko Hara, Nukata-gun, all of Japan

[73] Assignee: Denso Corporation, Kariya, Japan

[*] Notice: The term of this patent shall not extend beyond the expiration date of Pat. No. 5,470,770.

[21] Appl. No.: 605,637

[22] Filed: Feb. 22, 1996

Related U.S. Application Data

[63] Continuation-in-part of Ser. No. 413,410, Mar. 30, 1995, Pat. No. 5,470,770.

[30] Foreign Application Priority Data

| Mar. 30, 1994 | [JP] | Japan | 6-60693 |
| Mar. 31, 1994 | [JP] | Japan | 6-62448 |
| Mar. 31, 1994 | [JP] | Japan | 6-63220 |
| Sep. 9, 1994 | [JP] | Japan | 6-215769 |
| Dec. 27, 1994 | [JP] | Japan | 6-324694 |
| Feb. 22, 1995 | [JP] | Japan | 7-033666 |
| Oct. 30, 1995 | [JP] | Japan | 7-281557 |

[51] Int. Cl.⁶ .................................. H01L 21/332
[52] U.S. Cl. ........................ 438/138; 438/135; 438/268; 438/710
[58] Field of Search ................. 437/40, 41, 44, 437/69, 72, 73, 913, 915, 154; 148/DIG. 126; 438/135, 138, 268, 710

[56] References Cited

U.S. PATENT DOCUMENTS

| 4,412,378 | 11/1983 | Shinada . |
| 4,731,343 | 3/1988 | Beinvogi . |
| 4,735,824 | 4/1988 | Yamabe . |
| 5,385,852 | 1/1995 | Oppermann et al. . |
| 5,460,985 | 10/1995 | Tokura et al. . |
| 5,532,179 | 7/1996 | Chang et al. ............. 437/154 |

FOREIGN PATENT DOCUMENTS

| 0550770 | 7/1993 | European Pat. Off. . |
| 583 023 | 2/1994 | European Pat. Off. . |
| 4300806 | 12/1993 | Germany . |
| 58-93275 | 6/1983 | Japan . |
| 61-141151 | 6/1986 | Japan . |
| 61-199666 | 9/1986 | Japan . |
| 62-12167 | 1/1987 | Japan . |
| 63-250852 | 10/1988 | Japan . |
| 63-266882 | 11/1988 | Japan . |
| 2-86136 | 3/1990 | Japan . |
| 4-58532 | 2/1992 | Japan . |
| 4-92473 | 3/1992 | Japan . |
| 9303502 | 2/1993 | WIPO . |

OTHER PUBLICATIONS

Wolf et al., "Silicon Processing for the VLSI Era", vol. 1, 1986, pp. 539–583.

(List continued on next page.)

*Primary Examiner*—Tuan H. Nguyen
*Attorney, Agent, or Firm*—Cushman Darby & Cushman IP Group of Pillsbury Madison & Sutro LLP

[57] ABSTRACT

A manufacturing method of a vertical DMOSFET having a concave channel structure, which does not permit the introduction of defects or contaminant into the channel part and which can make the shape of the groove uniform, is disclosed. On a surface of a (100)-oriented n⁻-on-n⁺ epitaxial wafer is formed an initial groove by chemical dry etching. The grooved surface is then oxidized by LOCOS technique to form a LOCOS oxide film, whereby the concave structure is formed on the epitaxial wafer. The concave width is set to be at least twice the concave depth, and the sidewall angle is set to be approximately 50° to make the sidewall plane (111) of high channel mobility plane. Following this process, p-type and n-type impurities are diffused from the main surface using the LOCOS oxide film as a double diffusion mask to form a body region and a source region.

12 Claims, 19 Drawing Sheets

OTHER PUBLICATIONS

Chang et al., "Self–Aligned UMOSFET's with a Specific On–Resistance of 1 mΩ cm$^2$" IEEE Transactions on Electron Devices, vol. ED–34, No. 11, Nov. 1987, pp. 2329–2334.

Nikkei Electronic May 1986, No. 395, pp. 165–188.

Lee Y H et al: "Silicon Doping Effects in Reactive Plasma Etching," Journal of Vacuum Science & Technology B (Microelectronics Processing and Phenomena), Mar.–Apr. 1986, USA, vol. 4, No. 2, ISSN 0734–211X, pp. 468–475, XP002006301.

Gill M D: "A Simple Technique for Monitoring Undercutting in Plasma Etching", Solid–State Electronics, Sep. 1980, UK, vol. 23, No. 9, ISSN 0038–1101, p. 995 XP002006201.

N. Tokura et al "The DMOS Consisting of Channel Region Defined by LOCOS (LOCOS–DMOS): A New Process/Device Technology for Low On–Resistance Power MOSFET,"5th International symposium on Power Semiconductor Device and ICs,May 18–20, 1993.

N. Tokura et al., Concave–DMOSFET: A New Super Low on–Resistance Power MOSFET,: The 1994 International Conference on solid State Devices and Materials, Yokohama, Aug. 23–25, 1994.

H. Sakai et al., Methods to Improve the surface Planarity of Locally Oxidized Silison Devices.: J. electrochem.Soc.:Solid–State Science and Technology, vol. 124, No. 2, Feb. 1977,pp. 318–320.

N. Tokura et al., Concave–DMOSFET: A New Super–Low on–Resistance Power MOSFET,: Japanese Journal of Applied Physics, vol. 34 No. 2B, Feb. 1995,pp. 903–908.

"Developint Power MOSFET of 50mΩmm," Nikkei Electronics, Sep. 5, 1994, (No.616), pp. 15–16.

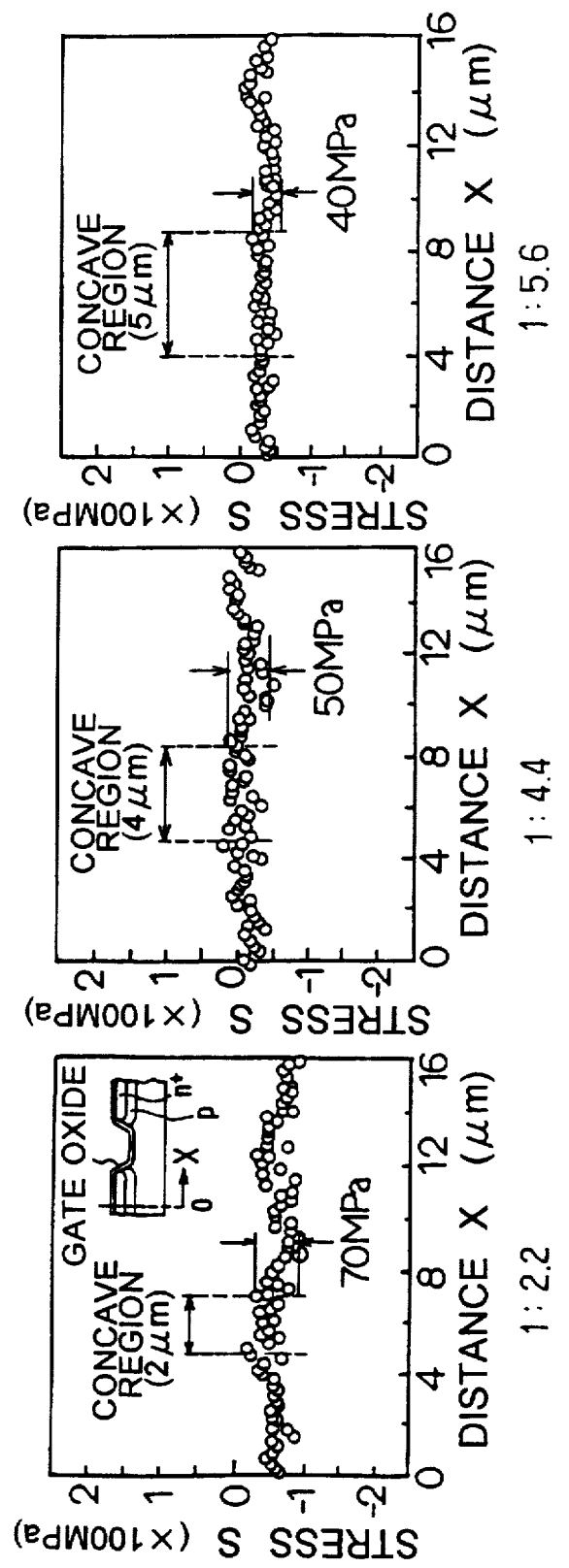

METHOD OF MANUFACTURING A VERTICAL SEMICONDUCTOR DEVICE

CROSS REFERENCE TO RELATED APPLICATION

This application is a continuation-in-part of U.S. application Ser. No. 08/413,410, now U.S. Pat. No. 5,470,770 filed Mar. 30, 1995 and claims priority from Japanese Patent Application Nos. (Hei) 7-33666 and No. (Hei) 7-281557, incorporated herein by reference. It is related to those applications and Japanese Patent Application Nos. (Hei) 6-60693, (Hei) 6-62448, (Hei) 6-63220, (Hei) 6-215769 and (Hei) 6-324694, also incorporated herein by reference.

BACKGROUND OF THE INVENTION

1. Field of the Invention

The present invention generally relates to a semiconductor device used as a power semiconductor device, e.g., a vertical MOSFET (metal oxide semiconductor field effect transistor) and a vertical IGBT (insulated gate bipolar transistor), and can be suitably employed for a MOSIC, etc. as a single unit or with the incorporation of a power semiconductor device.

2. Related Arts

Recently, a vertical type power MOSFET has been used in many industrial fields for various features thereof such as high frequency characteristics, fast switching speed and low power driving. Along with the spread of the vertical power MOSFET, there is an increasing demand for lower loss and lower cost, while the ON-resistance reduction by means of microprocessing and cell shape improvement has reached its limit. For example, a planar type DMOSFET has a minimal point from which the ON-resistance will not decrease even if the unit cell dimension is miniaturized, and it has been known that the major cause of the existence of the minimal point is an increase in the JFET (junction field effect transistor) resistance located between two adjacent body junctions.

Various constructions have been proposed in an attempt to break through this limit. Common to these proposals is a construction in which a groove is formed on an element surface and a channel part (inversion layer formation region) is disposed on a side surface of the groove. By this construction, even if the unit cell dimension is reduced, the consequent increase in the JFET resistance is negligible.

An example of the conventional manufacturing method with the above construction with the channel part on the side surface of the groove has been disclosed in the Japanese Unexamined Patent Publication No. 61-199666, for example, in which the groove is formed by means of RIE (reactive ion etching) and the channel part is formed on the side surface of the formed groove. The RIE is a physical etching technique with a high degree of controllability and features an excellent anisotropy and a consequent high resistance to side etch due to the acceleration of ionized gas in a constant direction. However, there is a problem with the RIE that in as the ionized gas physically collides against the semiconductor device, a lattice defect is inevitably caused in the etched surface, consequently channel mobility is degraded; and as a result, the ON-resistance increases.

Manufacturing methods using wet etching techniques have been disclosed in International Publication No. PCT WO93/03502 and the Japanese Unexamined Patent Publication No. 62-12167, as manufacyuring methods which can control the lattice detect. The proposed DMOS structure has a concave or bathtub-shaped groove structure fabricated by a combination of local oxidation of silicon (LOCOS) technique and chemically etching off the formed thick oxide film, which eliminates of JFET resistance while suppressing the occurrence of lattice defects by means of the concave configuration thereof. Both publications disclose a formation of an initial groove which is conducted by means of wet etching and prior to the formation of the above-mentioned thick oxide film by means of LOCOS technique.

SUMMARY OF THE INVENTION

However, according to the manufacturing methods disclosed in the above International Publication No. PCT WO93/03502 and the Japanese Unexamined Patent Publication No. 62-12167, the inventors of the present invention found from their extensive research and repetitive experiments that there is a problem in that as the wet etching technique, which is an isotropic etching technique, is used for forming the initial groove, an excessive etching over a specified etching width (i.e., side etch) is caused, a uniform groove with a constant depth can not be formed on the wafer surface due to uneven etching liquid, and consequently the process controllability is low.

Moreover, as the groove shape of the initial groove is not uniform within the wafer surface, even if the thick oxide film by LOCOS technique is then formed aligning with the initial groove, ununiformity of the groove shape remains in the resultant concave structure, and as a result, unevenness in the electric characteristics, such as channel mobility, among the FET cells becomes large. This causes an increase in the ON-resistance.

It may be possible to form the concave configuration, the side surface of which becomes the channel part, by LOCOS technique alone. However, this would lengthen the LOCOS oxidation time period and the angle of the groove side surface would be as gentle as approximately 30°, and this would make it impossible to micronize the cells and the reduction in the ON-resistance would not be promising. Furthermore, if the concave configuration is formed by the LOCOS technique alone, as the volume of Si almost doubles due to oxidation by nature, the channel part might be residually strained by the increase in the Si volume. Therefore, the etching process prior to the LOCOS oxidation, i.e., the initial groove formation process, is necessary by all means.

In view of the above problems, it is a primary object of the present invention to obtain an improved vertical DMOS type semiconductor device having a concave channel structure with uniformity within the wafer surface while suppressing the occurrence of defects in the channel part thereof.

According to the present invention, prior to performing the LOCOS technique, a specified region of the surface of a semiconductor substrate, where a concave structure is planned to be disposed, is removed by a chemical dry etching (CDE) method to form the initial groove. The chemical dry etching method, which is one of several dry etching methods, is high in process controllability, uniform in etching within the wafer surface, and high in reproducibility. The chemical dry etching causes comparatively less damage to the etching surface compared with other dry etching methods. After this chemical dry etching, the surface of the initial groove is oxidized.

In this oxidation process, according to the surface condition of the initial groove from which the oxidation is started, the condition of the boundary surface with the oxide film of the resultant semiconductor layer varies. That is, when the surface trenched by a physical etching technique, such as RIE, is oxidized, the oxidation advances without removing lattice defects, and the lattice defects remain on the surface of the resultant semiconductor layer. However, in the present invention, by applying the chemical dry etching to the surface of the initial groove, the initial groove with a few lattice defects can be formed, and in the following oxidation process using LOCOS technique, oxidation of the surface of the resultant semiconductor layer proceeds with uniformity from the start of the oxidation, and therefore, the surface of the resultant groove, i.e., a side wall surface of the concave structure formed by LOCOS, can have a few lattice defects. Here, the concave configuration is formed so that the sidewall of resultant groove has a flat surface and dull corners along the concavity, and so that the roughness of the interface between the oxide film and the resultant semiconductor layer at the flat surface of the sidewall surface can be made to be within a range of 4nm (i.e., ±2nm). Furthermore, as the flat surface positioned in the sidewall of the concavity (second groove) is used for a channel region, carriers can be suppressed from being scattered due to the surface condition of the flat surface, high channel mobility can be maintained, and thus, a low ONresistance can be obtained.

Moreover, as two processes of the chemical dry etching and the oxidation by means of LOCOS are applied to the formation of the concave configuration for the channel region, when the concave configuration is desired to be formed to a specified width, it is only necessary is to control the width to be oxidized or the width of the initial groove formed by chemical dry etching. Therefore, the shape of the second groove, i.e., the concave configuration for the channel region, can exactly be controlled. Herein, according to the present invention, the shape of the second groove is selected so that the depth of the resultant concavity (concave depth) is equal to or less than the half of the width of the inlet portion of the resultant concavity (concave width). Accordingly, the flat surface positioned in the sidewall of the concavity is smoothly connected to the upper surface of the semiconductor layer through the upper dull corner and is smoothly connected to the bottom wall of the concavity through the lower dull corner, and as a result of this, if the sidewall of the concavity is oxidized after removing the thick oxide film formed by LOCOS to form a gate insulating film, the connection point between the sidewall and bottom wall of the concavity is relieved from the induced stress. Consequently, crystal defects in the channel region due to the induced stress can be prevented from occurring at the time when the gate insulating film is formed, high channel mobility can be maintained, and a low ON-resistance can be obtained.

Furthermore, according to the present invention, as the sidewall of the concavity, which becomes a channel formation part, provides the flat surface which has the surface roughness of ±2nm or less and contains little crystal defects due to the induced stress, it is possible for the gate insulating film formed thereon to be thinned down to obtain a low threshold voltage of, for example, 2.5 V or lower while maintaining a high withstand voltage between a gate electrode and a body region.

It is preferable that the concave width should be set 0.5 μm or more. Also, it is preferable that the concave depth should be set between 0.5 μm and 5 μm. These dimensions are preferably selected in association with the miniaturization of FET cells to effectively obtain a low ON-resistance.

Furthermore, it is preferable that the index of plane of the flat surface obtained in the sidewall of the concavity should be selected to substantially be (111), (110), or (100) of silicon. As the planes of (111), (110) and (100) are flat in terms of atomic order of silicon, high channel mobility can be obtained. Also, planes approximate to, or slightly inclined from, these (111), (110) and (100) planes can provide high channel mobility.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 25A, 25B and 25C are graphs showing the residual stress distributions in silicon along the concave surface for concave widths of 2.82 m, 4.82 m and 5.82 m, respectively;

DETAILED DESCRIPTION OF THE PRESENTLY PREFERRED EXEMPLARY EMBODIMENTS

An embodiment according to the present invention will now be described referring to the appended drawings.

Figure 1A:
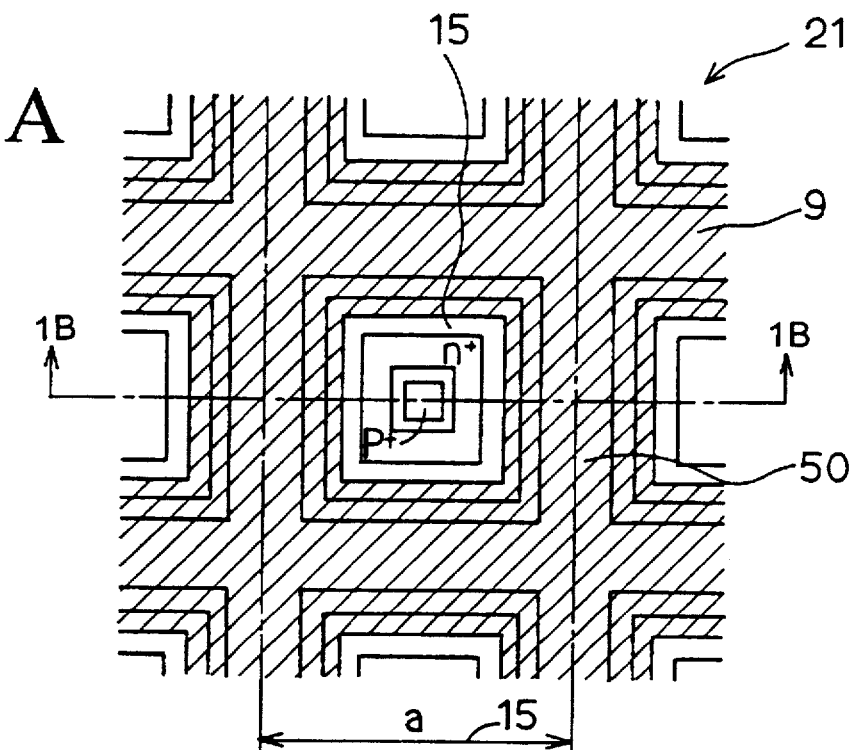
FIG. 1A is a plan view illustrating a part of a vertical type power MOSFET of a first embodiment according to the present invention.
Figure 1B:
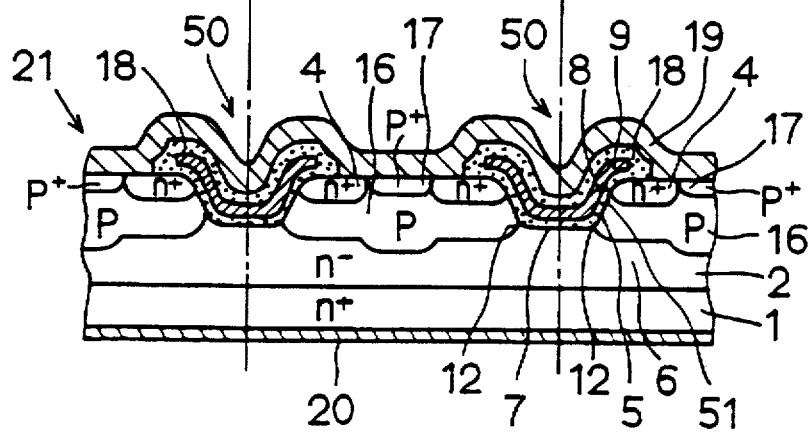
FIG. 1B is a cross-sectional view taken along line 1B—1B of FIG. 1A.
Figure 4:
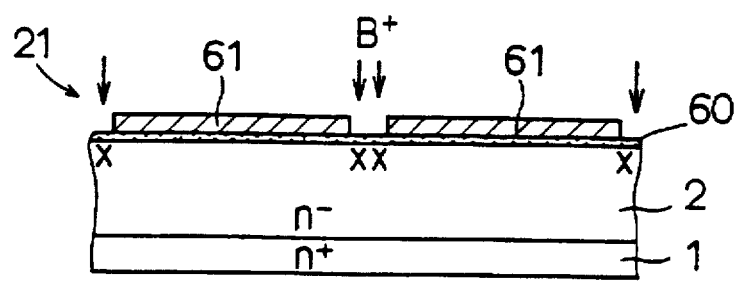
FIG. 4 is a cross-sectional view illustrating the manufacturing process of the important part of the vertical type power MOSFET of the first embodiment according to the present invention.
Figure 5:
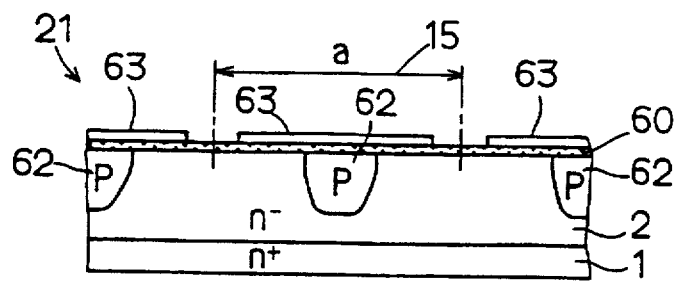
FIG. 5 is a cross-sectional view illustrating the manufacturing process of the important part of the vertical type power MOSFET of the first embodiment according to the present invention.
Figure 7:
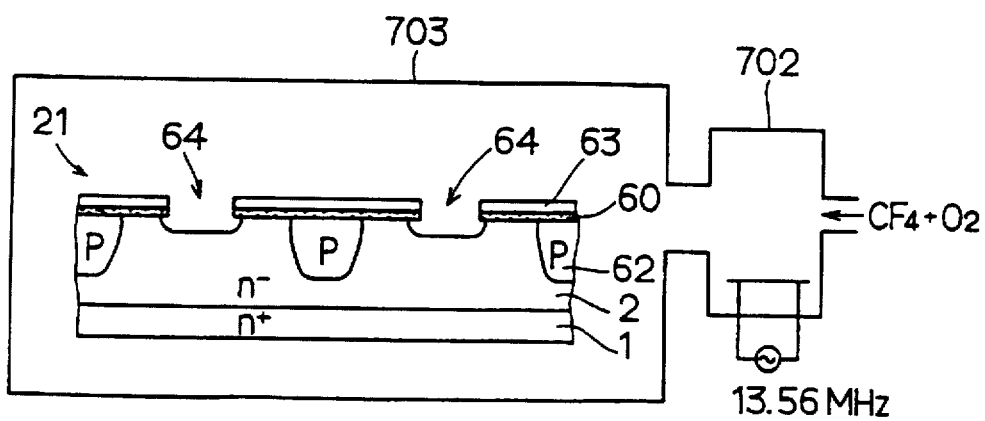
FIG. 7 is a view illustrating the manufacturing process of the vertical type power MOSFET of the first embodiment according to the present invention.
Figure 8:
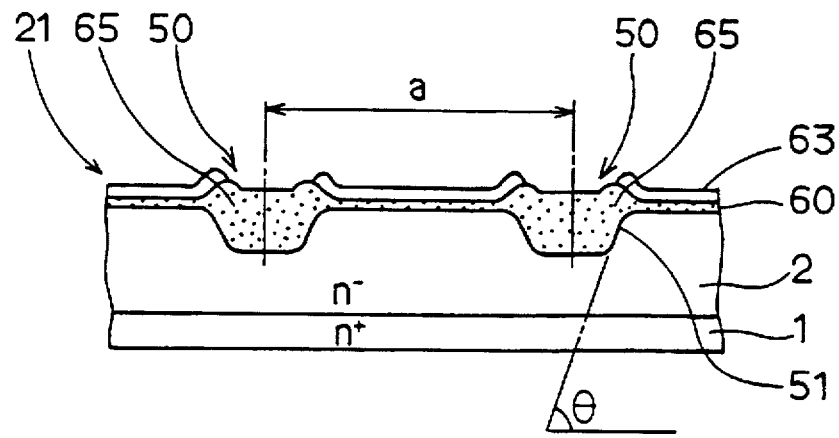
FIG. 8 is a cross-sectional view illustrating the manufacturing process of the important part of the vertical type power MOSFET of the first embodiment according to the present invention.
Figure 9:
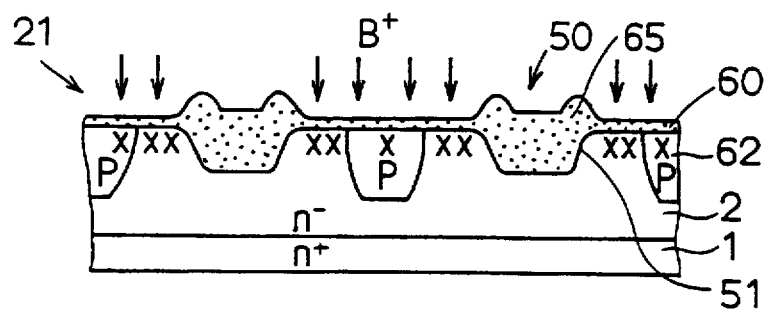
FIG. 9 is a cross-sectional view illustrating the manufacturing process of the important part of the vertical type power MOSFET of the first embodiment according to the present invention.
Figure 10:
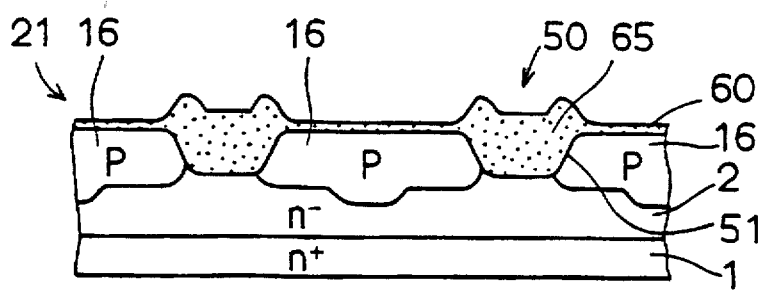
FIG. 10 is a cross-sectional view illustrating the manufacturing process of the important part of the vertical type power MOSFET of the first embodiment according to the present invention.
Figure 11:
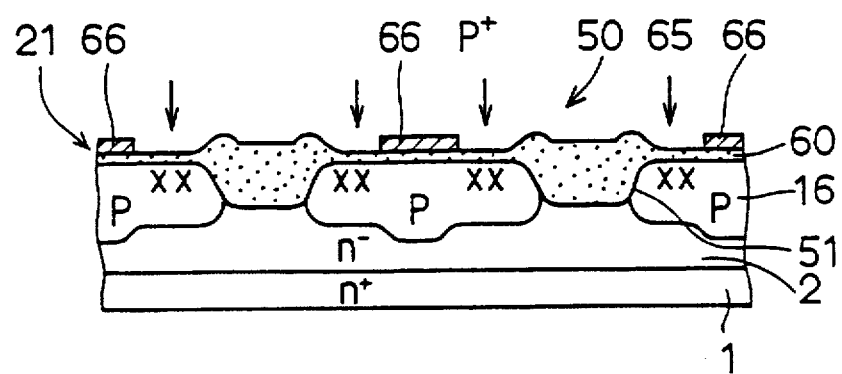
FIG. 11 is a cross-sectional view illustrating the manufacturing process of the important part of the vertical type power MOSFET of the first embodiment according to the present invention.
Figure 12:
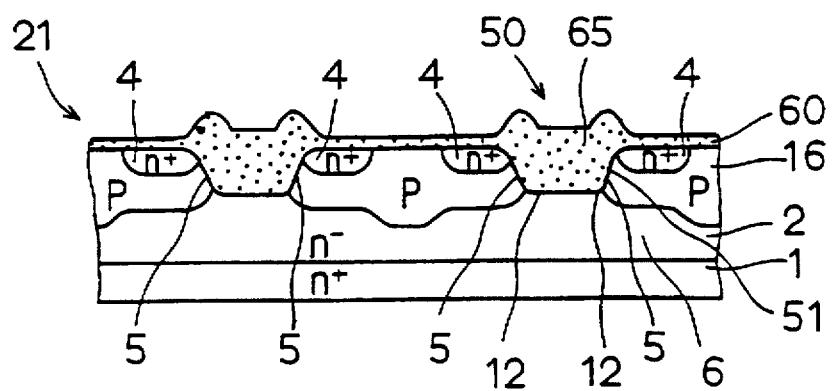
FIG. 12 is a cross-sectional view illustrating the manufacturing process of the important part of the vertical type power MOSFET of the first embodiment according to the present invention.
Figure 18:
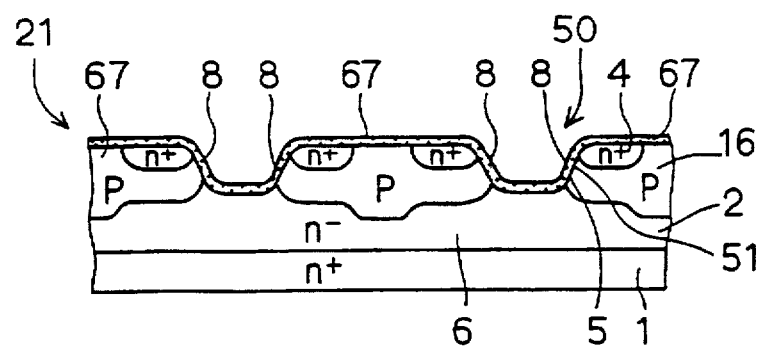
FIG. 18 is a cross-sectional view illustrating the manufacturing process of the important part of the vertical type power MOSFET of the first embodiment according to the present invention.
Figure 19:
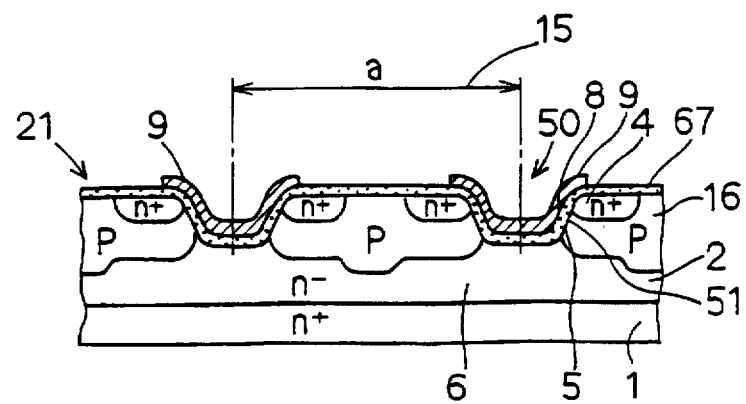
FIG. 19 is a cross-sectional view illustrating the manufacturing process of the important part of the vertical type power MOSFET of the first embodiment according to the present invention.
Figure 20:
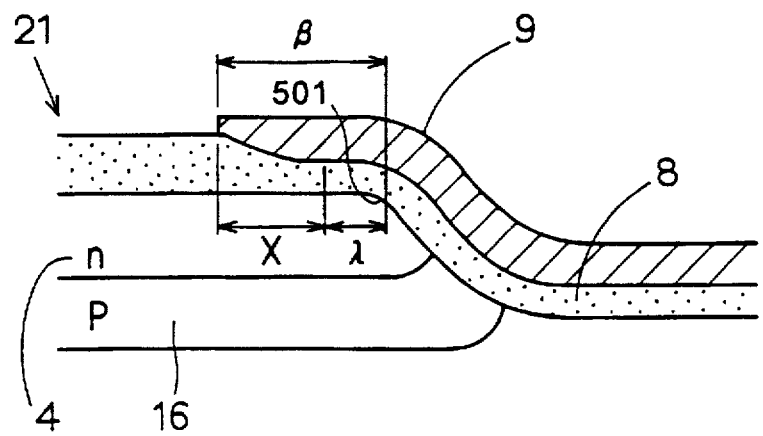
FIG. 20 is an enlarged cross-sectional view illustrating the manufacturing process of the important part of the vertical type power MOSFET of the first embodiment according to the present invention.
Figure 21:
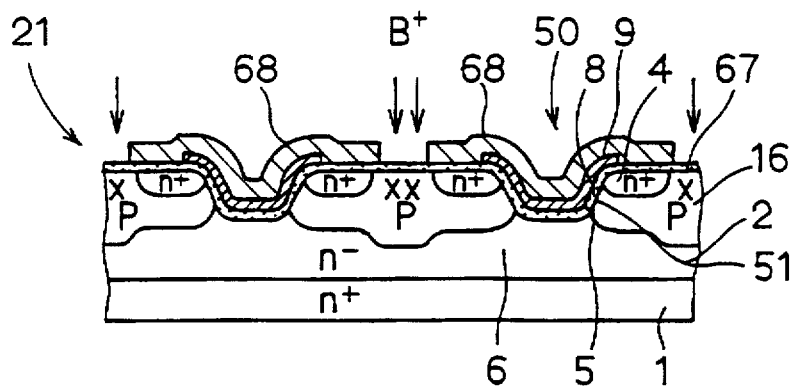
FIG. 21 is a cross-sectional view illustrating the manufacturing process of the important part of the vertical type power MOSFET of the first embodiment according to the present invention.
Figure 22:
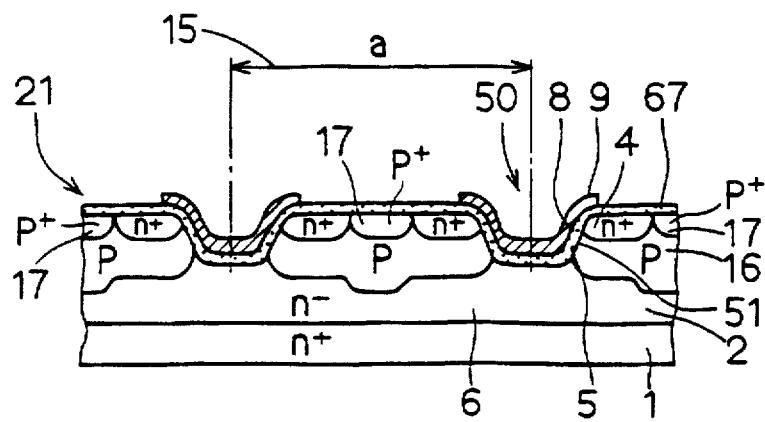
FIG. 22 is a cross-sectional view illustrating the manufacturing process of the important part of the vertical type power MOSFET of the first embodiment according to the present invention.

FIG. 1A is a plan view of a vertical type power MOSFET composed of numerous square unit cells according to the first embodiment of the present invention, and FIG. 1B is a cross-sectional view taken along line 1B—1B of FIG. 1A. FIGS. 2 through 22 are descriptive views of the respective stages of the manufacturing method for a vertical type power MOSFET according to the first embodiment, wherein FIG. 4 is a cross-sectional view of a wafer into which boron ions have been implanted to form a central part of a p-type body region (well region); FIG. 5 is a cross-sectional view of the wafer whose silicon nitride film has been patterned at a pitch which is equal to the dimension of a unit cell a for LOCOS (local oxidation of silicon); FIG. 8 is a cross-sectional view of the wafer on which a thick oxide film by LOCOS (hereinafter referred to as a LOCOS oxide film) has been formed; FIG. 9 is a cross-sectional view of the wafer into which boron ions have been implanted to form a p-type body region (channel-well region) by using the LOCOS oxide film as a mask; FIG. 10 is a cross-sectional view of the wafer in which the p-type body region has been formed by means of thermal diffusion; FIG. 11 is a cross-sectional view of the wafer into which phosphorous ions have been implanted to form an $n^+$-type source region by using the LOCOS oxide film as a mask; FIG. 12 is a cross-sectional view of the wafer in which the $n^+$-type source region has been formed by means of thermal diffusion; FIG. 18 is a cross-sectional view of the wafer on which a gate oxide film has been formed by means of thermal oxidation after the removal of the LOCOS oxide film; FIG. 19 is a cross-sectional view of the wafer with a gate electrode formed on the gate oxide film; FIG. 21 is a cross-sectional view of the wafer into which boron ions have been implanted to form a $p_+$-type body contact region; FIG. 22 is a cross-sectional view of the wafer in which the $p_+$-type body contact region has been formed by means of thermal diffusion; and FIG. 1B is the cross-sectional view of the completed wafer on which an interlayer insulating film, a source electrode and a drain electrode have been formed.

The main part (unit cell part) of the vertical type power MOSFET according to this embodiment is constructed as illustrated in FIGS. 1A and 1B, in which numerous unit cells 15 are laid out lengthwise and breadthwise at a pitch (unit cell dimension) of a.

In FIGS. 1A and 1B, a wafer 21 is composed of a semiconductor substrate 1 comprising $n^+$-type silicon having an impurity density of $2 \times 10^{19}$ cm$^{-3}$ and a thickness of 100–400 μm, and an $n^-$-type epitaxial layer 2 having an impurity density of approximately $10^{16}$ cm$^{-3}$ and a thickness of approximately 7 μm formed on the semiconductor substrate 1, and as described above, numerous unit cells 15 are regularly laid out on the main surface of the wafer 21. On the main surface of the wafer 21 is formed a LOCOS oxide film (described after) to a thickness of approximately 1 μm to form a U-groove (i.e., concave structure) 50 at a pitch of the unit cell dimension a (=approximately 16 μm) and by diffusion self-alignment using this oxide film as a double diffusion mask are formed a p-type body region 16 to a junction depth of approximately 1 μm and an $n^+$-type source region 4 to a junction depth of approximately 0.5 μm, whereby a channel 5 of approximately 0.5 μm in channel length is defined on the sidewall part 51 of the U-groove 50. Incidentally, the p-type body region 16 is set to a junction depth which does not permit the p-type region 16 to be fractured due to breakdown at an edge part 12 on the bottom of the U-groove 50. Furthermore, boron ions have been implanted into the central part of the p-type body region 16 beforehand to deepen the junction depth in the central part of the p-type region 16 down from the circumference, so that a breakdown can be caused when a high voltage is applied between the drain electrode and the source electrode. Namely, the bottom wall of the U-groove 50 is set to be positioned at a depth shallower than the p-type body region 16. After th e double diffusion, the LOCOS oxide film, which is used for forming the U-groove 50 as well as for the diffusion mask, is removed, a gate oxide film 8 is formed to a thickness of approximately 50 nm on the inner wall of the U-groove 50 and on the gate oxide film 8 are formed a gate electrode 9 with polysilicon to a thickness of approximately 400 nm and an interlayer insulating film 18 with borophosphosilicate glass (BPSG) to a thickness of approximately 1 μm. Furthermore, a $p_+$-type body contact region 17 is formed to a junction depth of approximately 0.5 μm in the central part surface of the p-type body region 16 and ohmic contact is made between a source electrode 19 formed on the interlayer insulating film 18 and the $n^+$-type source region 4 and $p_+$-type body contact region 17 through a contact hole. On the other hand, a drain electrode 20 is formed commonly on the back surface of the semiconductor substrate 1 to make ohmic contact therewith.

An example of the manufacturing method according to this embodiment will now be described.

Figure 2:
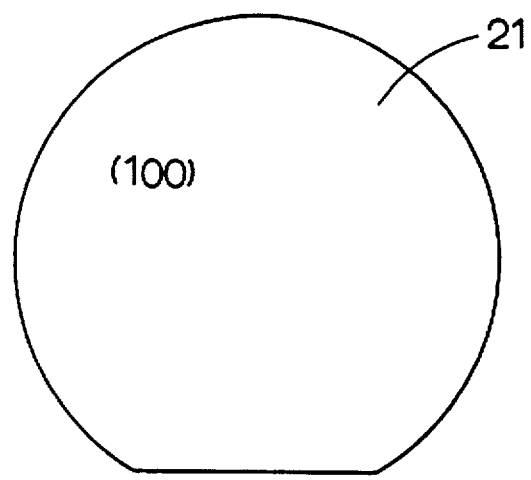
FIG. 2 is a plan view illustrating the manufacturing process of the vertical type power MOSFET of the first embodiment according to the present invention.
Figure 3:
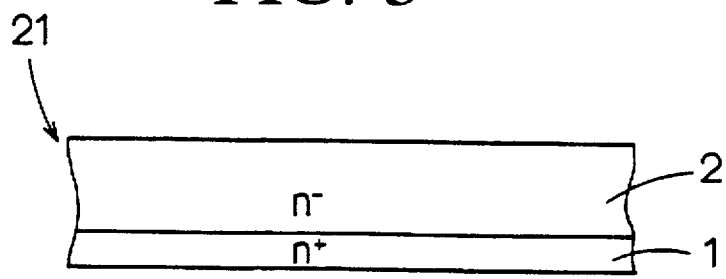
FIG. 3 is a cross-sectional view illustrating the manufacturing process of an important part of the vertical type power MOSFET of the first embodiment according to the present invention.

A wafer 21 is prepared in which, as illustrated in FIGS. 2 and 3, an $n^-$-type epitaxial layer 2 is formed by means of homo-epitaxial growth on the main surface of the (100)-oriented $n^+$-type silicon substrate 1 (semiconductor substrate corresponds to this $n^-/n^+$ structure). The impurity concentration of the $n^+$-type silicon substrate 1 is approximately $2 \times 10^{19}$ cm$^{-3}$, and the thickness of the epitaxial layer 2 is approximately 7 μm and the impurity concentration thereof is approximately $10_{16}$ cm$^{-3}$. Then, as shown in FIG. 4, a field oxide film 60 is formed to a thickness of approximately 50 nm by thermally oxidizing the main surface of the wafer 21 and subsequently a photoresist film 61 is deposited on the field oxide film 60 and the photoresist film 61 is patterned to form a pattern opened in the central part of a region where a cell is to be formed by means of well-known photolithographic techniques. Then, boron ions (B+) are implanted into the epitaxial layer 2 by using the photoresist film 61 as a mask.

As illustrated in FIG. 5, after removing the photoresist film 61, a p-type diffusion region 62 is formed to a junction depth of approximately 1 μm by means of thermal diffusion. This p-type diffusion region 62 ultimately constitutes a part of the p-type body region 16 (described later) and plays a role of improving the surge resistance of the device by stably causing a breakdown at the bottom part of the p-type diffusion area when a high voltage is applied to between the drain electrode and the source electrode.

Furthermore, as illustrated in FIG. 5, a silicon nitride film 63 is deposited to a thickness of approximately 200 nm on the main surface of the wafer 21. Then, as illustrated in the plan view of FIG. 6, the silicon nitride film 63 is patterned to be vertical and parallel to an orientation of <011> to form a lattice-like open pattern opening at a pitch of a (dimension of unit cell 15). During the formation of this open pattern, mask-alignment is conducted so that the above p-type diffusion region 62 can be positioned in the central part of the pitch.

The field oxide film 60 is then etched using the silicon nitride film 63 as a mask. Following this, as illustrated in FIG. 7, a chemical dry etching (CDE) is performed on the resultant wafer 21. That is to say, a chemically active species is made by generating plasma within a discharge chamber 702 into which carbon tetrafluoride and oxygen gases are supplied, the active species is transported into a reaction chamber 703, and an initial groove 64 is isotropically formed by chemically dry-etching the $n^-$-type epitaxial layer 2 within the reaction chamber 703.

Next, as illustrated in FIG. 8, the part of the groove 64 is thermally oxidized using the silicon nitride film 63 as an oxidation mask. This is an oxidation method well known as LOCOS (local oxidation of silicon) method. By this oxidation, a LOCOS oxide film 65 is formed on the surface of the wafer 21 so as to have the lattice-like surface pattern shape, and concurrently the shape of a U-groove 50 (concave structure) is defined by erosion of the surface of the $n^-$-type epitaxial layer 2 due to the growth of the LOCOS oxide film 65.

In the above process, the conditions of chemical dry etching and LOCOS oxidation are selected by controlling an elevation angle θ of the sidewall of the U-groove (FIG. 8) so that the index of plane of the channel forming part on the sidewall surface of the U-groove 50 can be approximately (111).

The inside wall surface 51 of the U-groove 50 formed by the LOCOS oxidation as described above has a high flatness and a few defects, and the surface condition thereof is as good as the main surface of the wafer 21 in the initial stage illustrated in FIG. 2.

Then, as illustrated in FIG. 9, boron ions are implanted through the thin field oxide film 60 using the LOCOS oxide film 65 as a diffusion mask. At this time, the boundary part between the LOCOS oxide film 65 and the field oxide film 60 constitutes a self-alignment position to exactly define a region into which boron ions are implanted.

Then, as illustrated in FIG. 10, thermal diffusion is applied to diffuse the implanted boron ions into the epitaxial layer 2 to a junction depth of approximately 1 μm. As the result of this thermal diffusion, the p-type diffusion region 62 previously formed in the process illustrated in FIG. 5 and the boron diffusion region into which boron ions have been implanted in the process illustrated in FIG. 9 are integrated into the p-type body region 16 (equivalent to a body region), both ends of which are self-aligned and defined by the positions of the sidewalls of the U-groove 50.

Subsequently, as illustrated in FIG. 11, after forming a photoresist film 66 which is patterned so as to cover the central part of the surface of the p-type body region 16 surrounded by the LOCOS oxide film 65, phosphorous ions are implanted through the thin field oxide film 60 using the photoresist film 66 and the LOCOS oxide film 65 as a diffusion mask. In this process, like the process illustrated in FIG. 9 in which boron ions have been implanted, the boundary part between the LOCOS oxide film 65 and the field oxide film 60 constitutes a self-alignment position, whereby the ion implantation region can exactly be defined.

The next process is, as illustrated in FIG. 12, to apply thermal diffusion to form an $n^+$-type source region 4 of approximately 0.5 μm in junction depth and define a channel 5 (equivalent to a channel region) as well. The end surface being in contact with the U-groove 50 in the region of the $n^+$-type source region 4 is self-aligned and defined in the position of the sidewall of the U-groove 50.

The processes illustrated in FIGS. 9 to 12 fix the junction depth and shape of the p-type body region 16. Here, a point is that the shape of the p-type body region 16 is perfectly symmetric with respect to the U-groove 50 due to the self-alignment and thermal diffusion.

Figure 13:
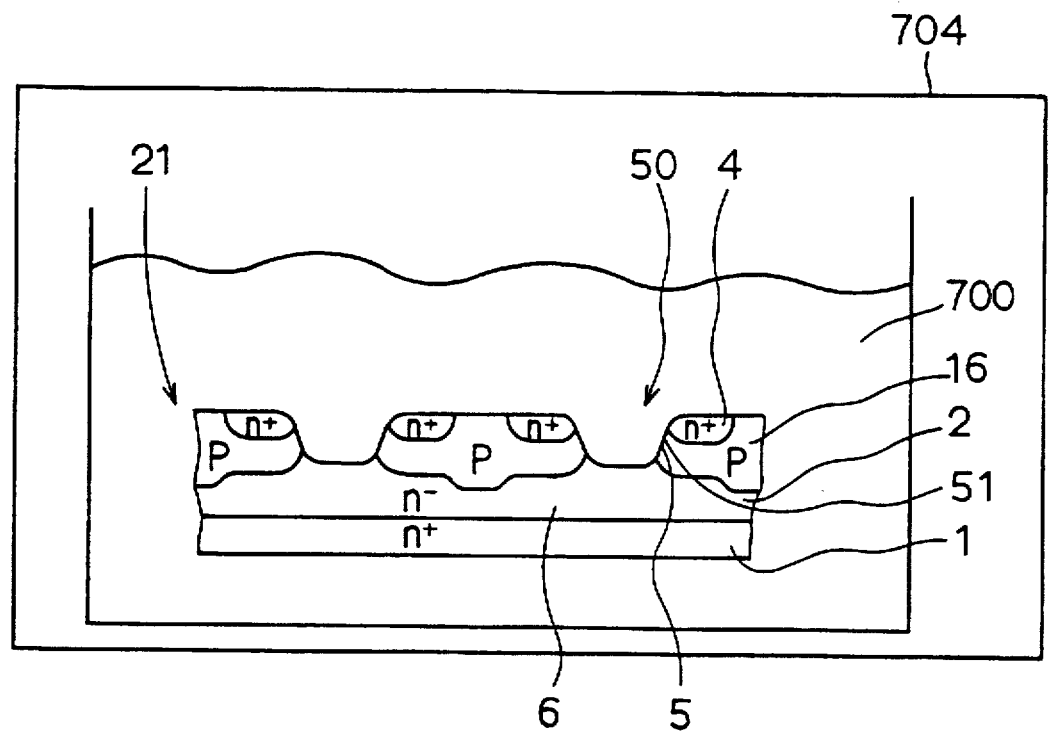
FIG. 13 is a view illustrating the manufacturing process of the vertical type power MOSFET of the first embodiment according to the present invention.

Next, as illustrated in FIG. 13, an inside wall 51 of the U-groove 50 is exposed by removing the LOCOS oxide film 65 while terminating the exposed silicon surface with hydrogen within an aqueous solution containing hydrofluoric acid and adjusted to an acidity/alkalinity of around pH5 with ammonium fluoride. This process may be performed by applying an shading cloth 704 over the wafer 21 to shade from light the surface on which the LOCOS oxide film is formed.

After the completion of the above process, the wafer 1 is taken out of the aqueous solution and dried in a clean air.

Figure 14:
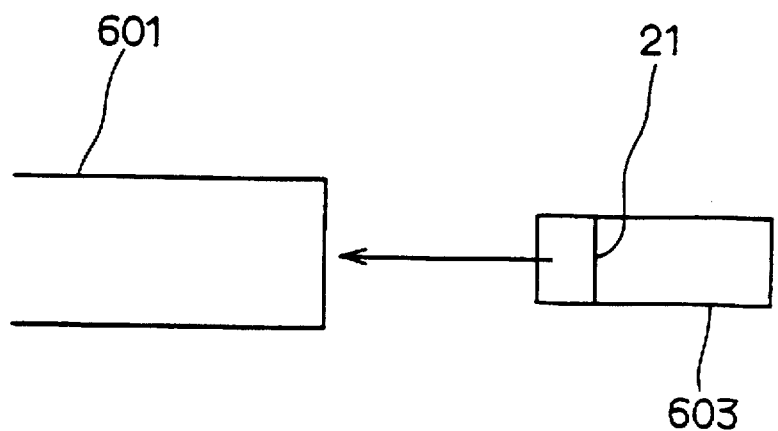
FIG. 14 is a view illustrating the manufacturing process of the vertical type power MOSFET of the first embodiment according to the present invention.
Figure 15:
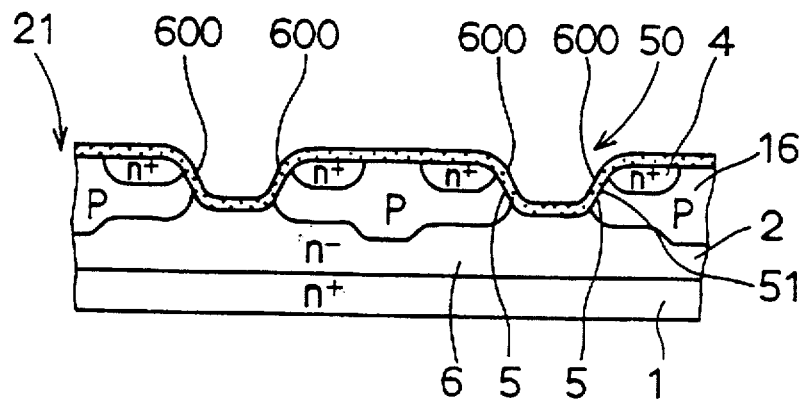
FIG. 15 is a cross-sectional view illustrating the manufacturing process of the important part of the vertical type power MOSFET of the first embodiment according to the present invention.
Figure 16:
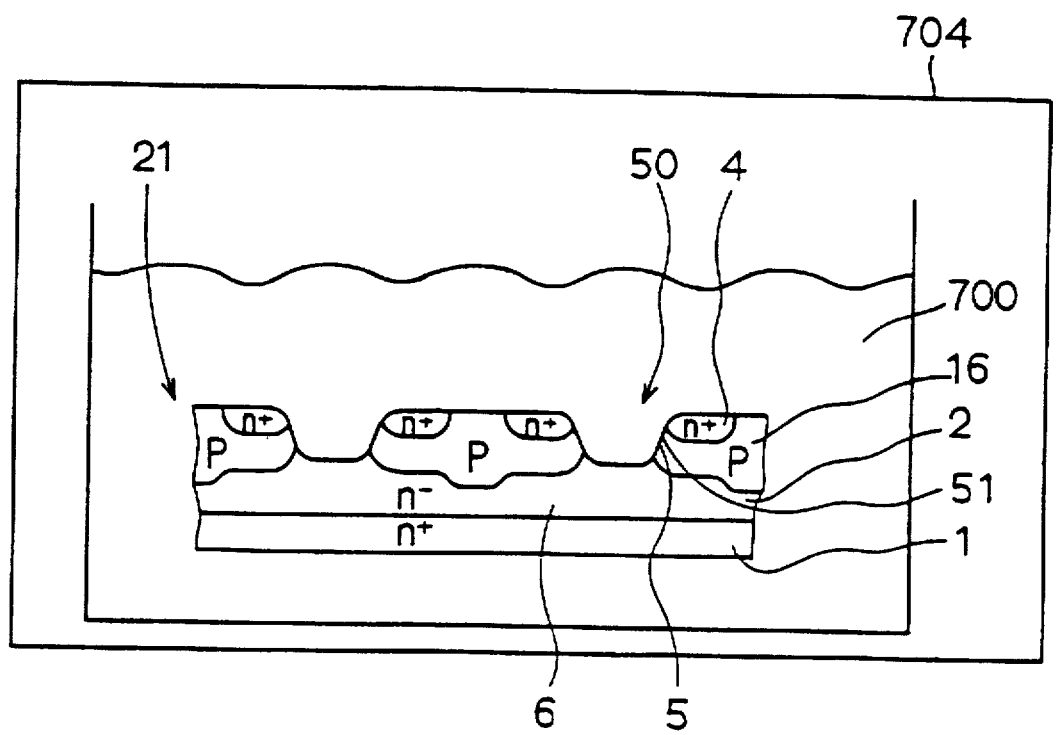
FIG. 16 is a view illustrating the manufacturing process of the vertical type power MOSFET of the first embodiment according to the present invention.
Figure 17:
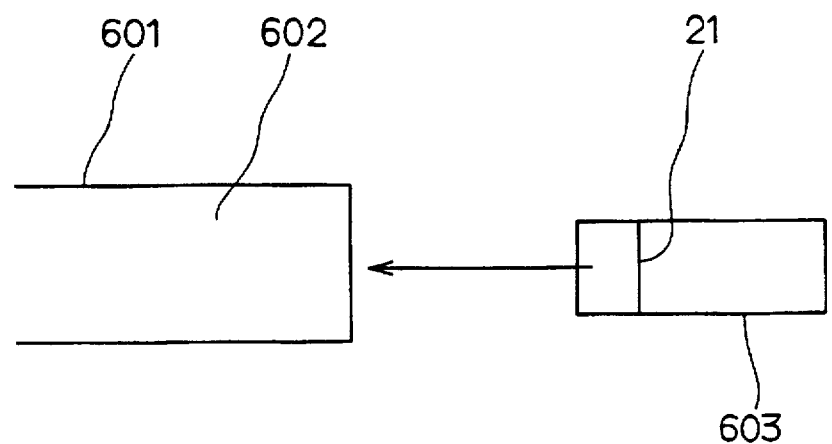
FIG. 17 is a view illustrating the manufacturing process of the vertical type power MOSFET of the first embodiment according to the present invention.

Then, as illustrated in FIG. 15, an oxide film 600 is formed on a sidewall surface of the U-groove 50 (i.e., the surface of the p-type body region 16 where the channel 5 is to be formed) until the (111) plane appears at the interface between the sidewall surface and the formed oxide film 600. By this thermal oxidation process, the flatness of the surface where the channel 5 is to be formed is improved in terms of atomic order. As illustrated in FIG. 14, this thermal oxidation process is performed by slowly inserting a wafer boat 603 holding the wafer 21 into an oxidation furnace 601 which is maintained within the oxygen atmosphere at a temperature of approximately 1,000° C. In this thermal oxidation process, as the initial stage of the oxidation is performed at a comparatively low temperature, the scattering of impurities within the p-type body region 16 and $n^+$-type source region 4 to the outside of the wafer 21 during the thermal oxidation process can be suppressed. Incidentally, the thus formed oxide film 600, which is a so-called pad oxide film, is removed while applying the shading cloth 704 as illustrated in FIG. 16. The removal of the oxide film 600 is also performed while terminating the exposed silicon surface with hydrogen within an aqueous solution containing hydrofluoric acid and adjusted to an acidity/alkalinity of around pH5 with ammonium fluoride. The inside wall surface 51 of the U-groove 50 formed by this method is a good silicon surface with a high flatness and a few defects.

As illustrated in FIG. 18, a gate oxide film 8 is then formed to a thickness of approximately 50 nm on the sidewall surface and bottom wall surface of the U-groove 50 by thermal oxidation. This thermal oxidation process is, as described above and as illustrated in FIG. 17, performed by slowly transferring the wafer boat 603 holding the wafer 21 into an oxidation furnace 601 which is maintained within the oxygen atmosphere 602 at a temperature of approximately 1,000° C. In this thermal oxidation process, as the initial stage of the oxidation is performed at a comparatively low temperature, the scattering of impurities within the p-type body region 16 and $n^+$-type source region 4 to the outside of the wafer 21 during the thermal oxidation process can be suppressed. The film quality and thickness uniformity of the gate oxide film 8, the interface state density of the interface where the channel 5 is formed and the carrier mobility are as high as those of the conventional planar type DMOSFET.

Now, as illustrated in FIG. 19, the gate electrode 9 is formed by depositing a polysilicon film on the main surface of the wafer 21 to a thickness of approximately 400 nm and patterning the deposited polysilicon film so as to be separated by a distance which is shorter by 2 β than a distance between the inlet corners of two U-grooves 50 adjacent to each other. Then, the gate oxide film 8 is further oxidized (a thick film part is formed) so as to be thicker at the end part of the gate electrode 9. Here, when the length of a part where the gate oxide film 8 is thickened is x as illustrated in FIG. 20, the above mentioned β is set to be longer than x (β>x).

In this manner, the gate oxide film 8 is arranged to be a part λ which is uniform in thickness and thin (a thin film part) in the neighborhood of the semiconductor region 4 and on a surface part 501 of the semiconductor region 4 where the impurity concentration is lower than the impurity concentration of the flat part surface of the semiconductor region 4. In other words, the gate oxide film 8 is composed of the thin film part λ uniformly and thinly formed on the side of the U-groove 50 and the thick film part x thickly formed in comparison with the thin film part, and the gate electrode 9 formed on the gate oxide film 8 from the bottom part of the U-groove 50 to the top of the thick film part.

The processes illustrated in FIGS. 9 through 19 are important stages of the manufacturing process according to this embodiment, in which the p-type body region 16, the $n^+$-type source region 4 and the channel 5 are formed by using the LOCOS oxide film 65 as a double diffusion mask for self-alignment, then the LOCOS oxide film 65 is removed and then the gate oxide film 8 and the gate electrode 9 are formed.

Next, as illustrated in FIG. 21, boron ions are implanted through an oxide film 67 using a patterned photoresist film 68 as a mask.

Following the above, as illustrated in FIG. 22, a $p_+$-type body contact region 17 is formed to a junction depth of approximately 0.5 μm by thermal diffusion.

Then, as illustrated in FIG. 1B, the interlayer insulating film 18 is formed with BPSG on the main surface of the wafer 21 and contact holes are made in parts of the interlayer insulating film 18 to expose the $p_+$-type body contact region 17 and the $n^+$-type source region 4. Furthermore, the source electrode 19 is formed with an aluminum film and ohmic contact is made between the source electrode 19 and the $p_+$-type body contact region 17 and $n^+$-type source region 4 through the contact hole. Subsequently, a passivation film (not illustrated) is formed with silicon nitride, etc. for protecting the aluminum film by a plasma enhanced CVD (chemical vapor deposition) technique or the like. On the back surface of the wafer 21 is formed the drain electrode 20 with three layers of a Ti film, a Ni film and a Au film, an ohmic contact is made between the drain electrode 20 and the $n^+$-type semiconductor substrate 1.

Figure 23:
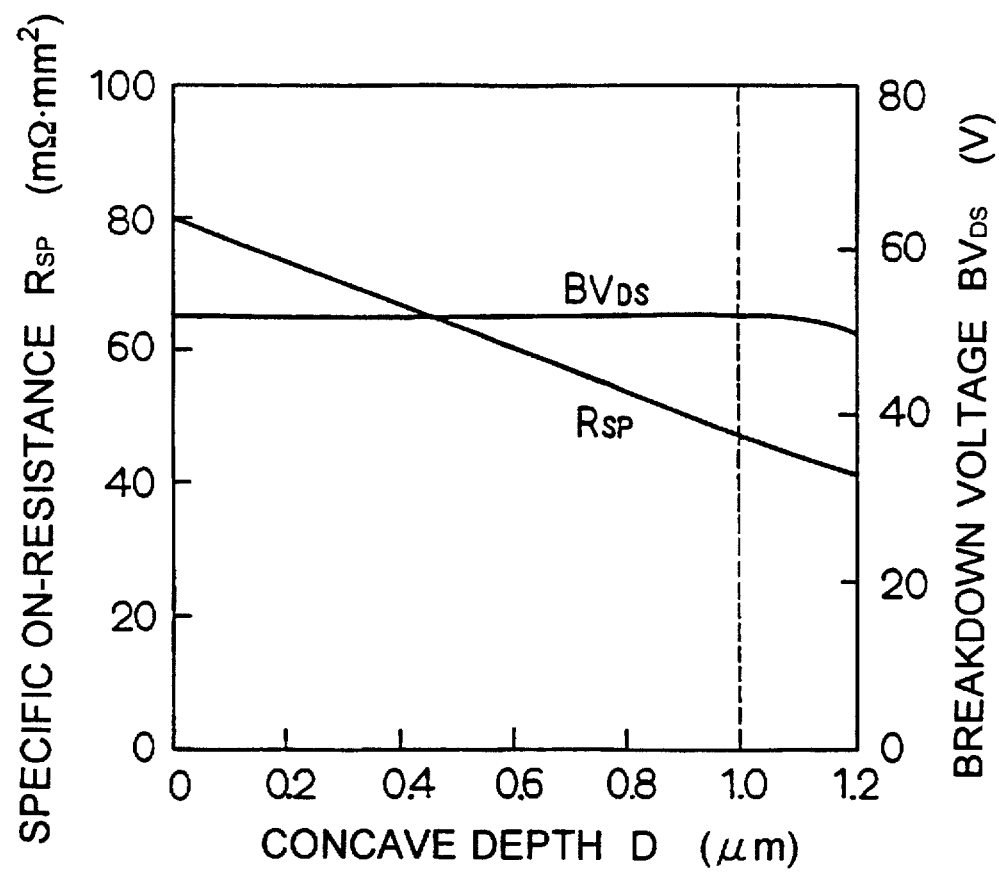
FIG. 23 is a graph showing the relationship between a specific ON-resistance $R_{sp}$ and a concave depth D and the relationship between a breakdown voltage $BV_{DS}$ and the concave depth D.
Figure 26A:
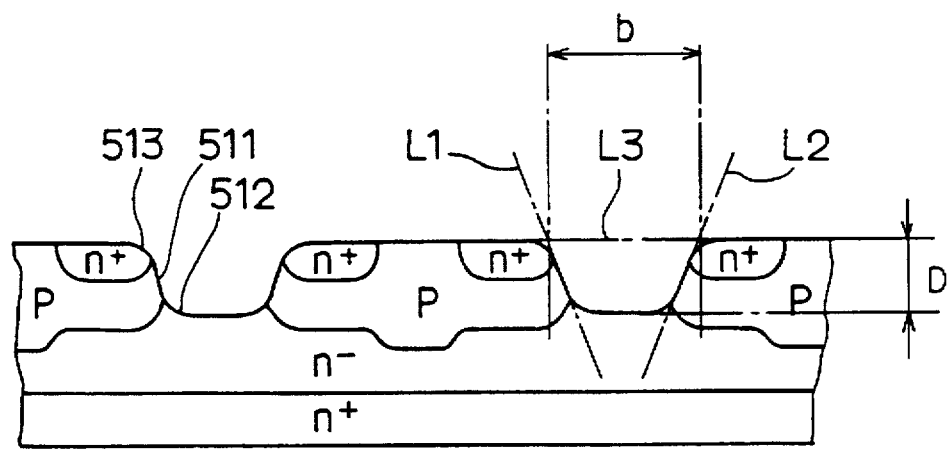
FIG. 26A is a diagram for explaining the definitions of the concave width b and the concave depth D.

As described above, the vertical power DMOSFET of the embodiment has a concave channel structure fabricated by a combination of LOCOS technique and diffusion self-alignment using the LOCOS oxide film 65 as a double diffusion mask, having dimensions of the unit cell (half unit cell) of 4.7 μm ×6.0 μm; thickness of the gate oxide film 8, 50 nm; channel length, 0.5 μm; junction depth of the p-type body region 16, 1.0 μm; junction depth of the $n^+$-type source region 4, 0.5 μm; and doping concentration of the epitaxial layer (drift region) 2, $10^{16}$ cm$^{-3}$. FIG. 23 shows the relationships between the specific ON-resistance $R_{SP}$, the drain-to-source breakdown voltage $BV_{DS}$ and the concave depth D when the concave depth D is changed from 0 to 1.2 μm in the construction described above. Here, the concave depth D is, as shown in FIG. 26A, defined by a vertical depth of the concave structure from the top semiconductor surface to the bottom wall surface of the concavity (U-groove) after formation of the gate oxide film.

It is understood from FIG. 23 that in case D=0 μm (equivalent to a conventional planar type DMOSFET), ON-resistance thereof is 80 mΩ·mm². However, ON-resistance decreases linearly as the concave depth D increases, and it is understood that, when the concave depth D=1.0 μm (equal to the p-body junction depth) is selected, JFET resistance component could be eliminated completely. ON-resistance Rsp of 47 mΩ·mm² is obtained. That is, according to the embodied DMOSFET having the concave structure (concave depth 1.0 μm), it is possible to reduce ON-resistance $R_{sp}$ to 41% of 80 mΩ·mm² of planar type DMOSFET (D=0).

As for the drain-to-source breakdown voltage $BV_{DS}$, the breakdown voltage, as shown in FIG. 23, is constant at 52 V for concave depth D≦1.0 μm with bulk breakdown at the body-drain junction, and 50 V for concave depth D=1.2 μm with surface breakdown at the concave structure. The surface breakdown causes undesirable hot carrier injection into the gate oxide film and degrades the interface between the semiconductor surface and the gate oxide film at the surface of the concave structure. Therefore, in order to prevent the surface breakdown from occurring, it is preferable that the concave depth should be selected not to be greater than the junction depth of the p-type body region.

According to this embodiment of the present invention constructed as described above, a specified region of the surface of the epitaxial layer 2 is removed by the chemical dry etching method prior to applying LOCOS technique. The chemical dry etching method, which is one of the dry etching methods, is high in process controllability, uniform in etching within the wafer surface and high in reproducibility. In particular, as the embodied chemical dry etching uses gas containing carbon tetrafluoride and oxygen, the process can exactly be performed with a high reproducibility by controlling the ratio of carbon tetrafluoride to oxygen. Furthermore, the chemical dry etching causes comparatively less damage to the etching surface compared with other dry etching methods. In addition to this, according to this embodiment, as there is no substantial cathode drop on the upper part of the semiconductor substrate 1 or the n⁻-type epitaxial layer 2 during the chemical dry etching process, there is no possibility that the ionized gas collides against the surface of the semiconductor layer at such a speed that the collision gives defects to the semiconductor surface. Accordingly, the surface of the formed groove 64 has a few defects.

After this chemical dry etching, the resultant surface of the groove 64 is locally oxidized using a LOCOS technique. Accordingly, the surface condition of the initial groove 64 formed by chemical dry etching can be made free from damages such as lattice defects, surface roughness and the like, and thus oxidation of the surface of the resultant initial groove 64 can be uniform from the start of the oxidation. Consequently, the resultant concave structure (U-groove 50) after LOCOS oxidation can have a smooth inside surface with few lattice defects, and as the obtained smooth surface of the U-groove 50 is used for the channel region 5, a low ON-resistance can be obtained.

Figure 26B:
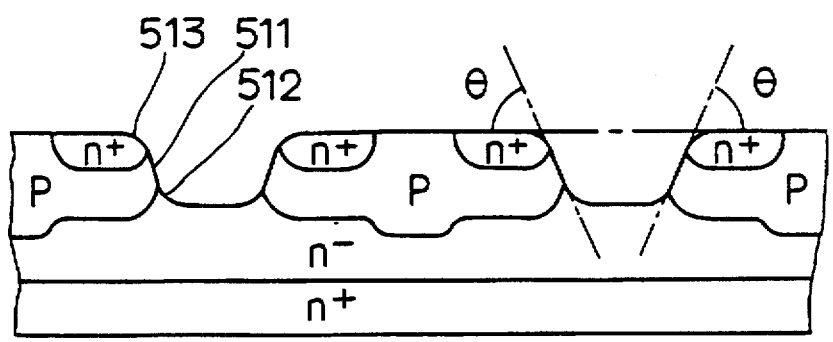
FIG. 26B is a diagram for explaining the definition of a sidewall angle θ which is an elevation angle of the flat surface in the sidewall.
Figure 27:
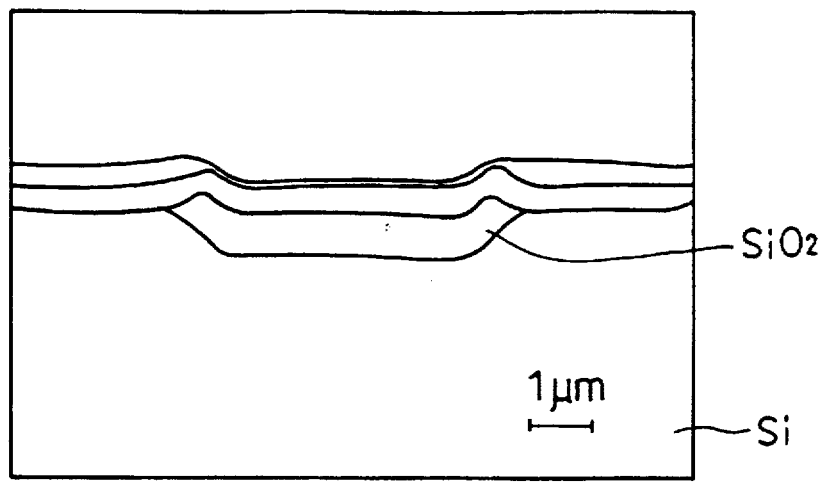
FIG. 27 is an illustrative view of SEM (scanning electron microscope) micrograph of the cross-sectional concave structure formed by LOCOS.

FIG. 27 shows an illustrative view of SEM micrograph of cross-sectional concave structure at the process stage equivalent to FIG. 8. In FIG. 27, the LOCOS oxide film with a thickness of 1 μm is grown on the surface of the (100)-oriented n⁻/n⁺ silicon substrate, the concave structure is determined by the formed LOCOS oxide film. The concave width corresponding to b in FIG. 26A, depth D and the sidewall angle corresponding to θ in FIG. 26B are 4 μm, 0.9 μm, and 55°, respectively. Also, flat surface and dull corners along the concave configuration are observed on the SEM microscopic scale.

Herein, as shown in FIGS. 26A and 26B, the concave width b after formation of the gate oxide film is defined by a length from the intersection point between the tangent line L3 (tangential to the semiconductor main surface) and the tangent line L1 (tangential to one flat surface 511 in the sidewall) to the intersection point between the tangent line L3 and the tangent line L2 (tangential to another flat surface 511 facing the L1 side in the sidewall), and the sidewall angle θ after formation of the gate oxide film is defined by an elevation angle (0<θ<90°) of the flat surface 511 to the semiconductor main surface or an elevation angle of a virtual plane tangential to an inflection point between the upper and lower dull corners of the sidewall of the concavity.

Figure 28:
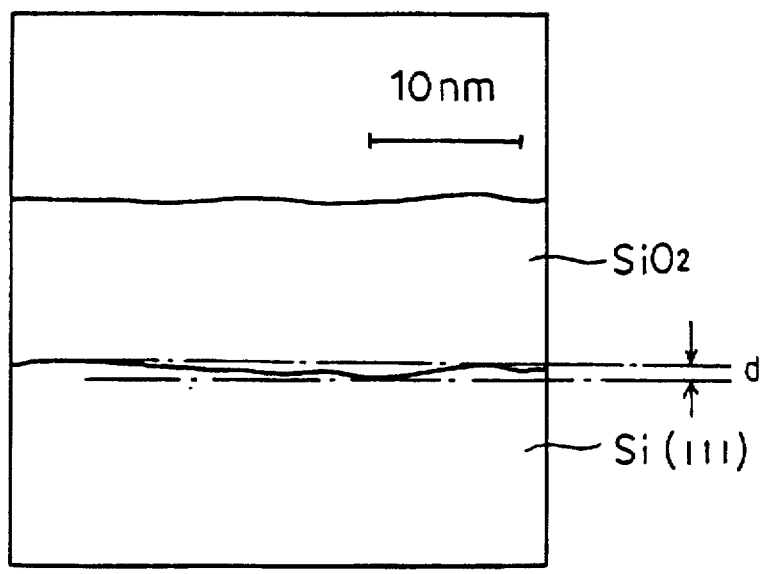
FIG. 28 is an illustrative view of TEM (transmission electron microscope) micrograph of the $SiO_2$/Si interface at the sidewall of the concave structure.

Furthermore, from the lattice image observed by TEM observation with X-ray diffraction, the sidewall plane is verified as (111) of high channel mobility plane. This is confirmed from the sidewall angle of 55 °±15° and the surface plane of the semiconductor main surface, i.e., (100) plane. The lattice image of silicon crystal adjacent to the SiO₂/Si interface shows no disorder and the interface structure abruptly changes from silicon crystal to SiO₂ amorphous region. Furthermore, as shown in FIG. 28, roughness d, which is locally observed, of the SiO₂/Si interface at (111) sidewall is observed as 4 nm or less (i.e., ±2nm), which is as small as that of observed (100) plane on the same wafer. Herein, as the (111) plane has characteristics of low phonon scattering and extremely high carrier mobility, by using this obtained (111) sidewall as a channel formation part, the ON-resistance of the end product, i.e., the embodied concave type DMOSFET, can be made extremely low. Furthermore, the surface roughness of the (111) sidewall is extremely small, e.g., ±2nm, and thus, carriers travelling therethrough can be prevent from surface scattering. As a result of this, high carrier mobility of (111) plane can be maintained, and the ON-resistance of the device can be made extremely low. Incidentally, the local observation area in this embodiment means an area of several 10 nm square, and FIG. 28 shows a case where the examined local observation area is 30–40 nm square.

As described above, according to the present embodiment, because the initial groove 64 is formed by means of chemical dry etching, the resultant concave structure (U-groove 50) after LOCOS oxidation can have a smooth and flat sidewall surface with few lattice defects and low roughness of ±2nm, and as the obtained smooth and flat sidewall surface of the U-groove 50 is used for the channel region 5, a low ON-resistance can be obtained.

In association with this, since the (100)-oriented wafer is selected, the U-groove 50 can be controlled to have a sidewall surface which is substantially oriented in (111), the ON-resistance of the end product can be further lowered. In short, in the above embodiment, the conditions of etching and LOCOS oxidation are selected by using an oxidation resistant mask patterned roughly at a right angle or roughly parallel to an direction of <011> on the surface of the selected (100)-oriented wafer, and an angle of the sidewall surface of the U-groove 50 is exactly controlled to be 55°±15°(54.7°). As a result of this, a crystal surface with a high mobility and an index of plane of (111) as per this embodiment can be obtained, whereby the ON-resistance can be reduced.

Furthermore, as two processes of chemical dry etching and LOCOS oxidation are applied to the formation of the concave channel structure, when the U-groove 50 is desired to be formed to a specified width, only what is required is to control the width to be oxidized, or the width of the initial groove 64 formed by chemical dry etching. Therefore, the shape of the U-groove 50, i.e., the concave configuration for the channel region, can exactly and simply be controlled.

Furthermore, according to the present embodiment, because the chemical dry etching proceeds isotropically, the corner part between the sidewall and bottom wall of the initial groove 64 can be made dull, and consequently the corresponding corner part of the resultant U-groove 50 formed by LOCOS oxidation can be also made dull in association with the effect of the concave dimension described later, whereby the gate-to-drain withstand voltage and the gate-to-source withstand voltage can be improved.

Moreover, the above-mentioned dull corner part of the resultant U-groove 50 makes it possible for the proximate sidewall region (channel 5 formation part) to be prevented from being stressed when the gate oxide film 8 is formed, crystal defects induced by such stress can be prevented from occurring in the channel region 5, and therefore the gate-to-body withstand voltage can also be improved in association with the later-mentioned residual stress elimination effect due to the concave dimension. This makes it possible for the gate oxide film to be thinned down to obtain a low threshold voltage of, for example, 2.5 V or lower while maintaining high gate-to-body withstand voltage.

Next, an ideal concave dimension will be explained.

Figure 24:
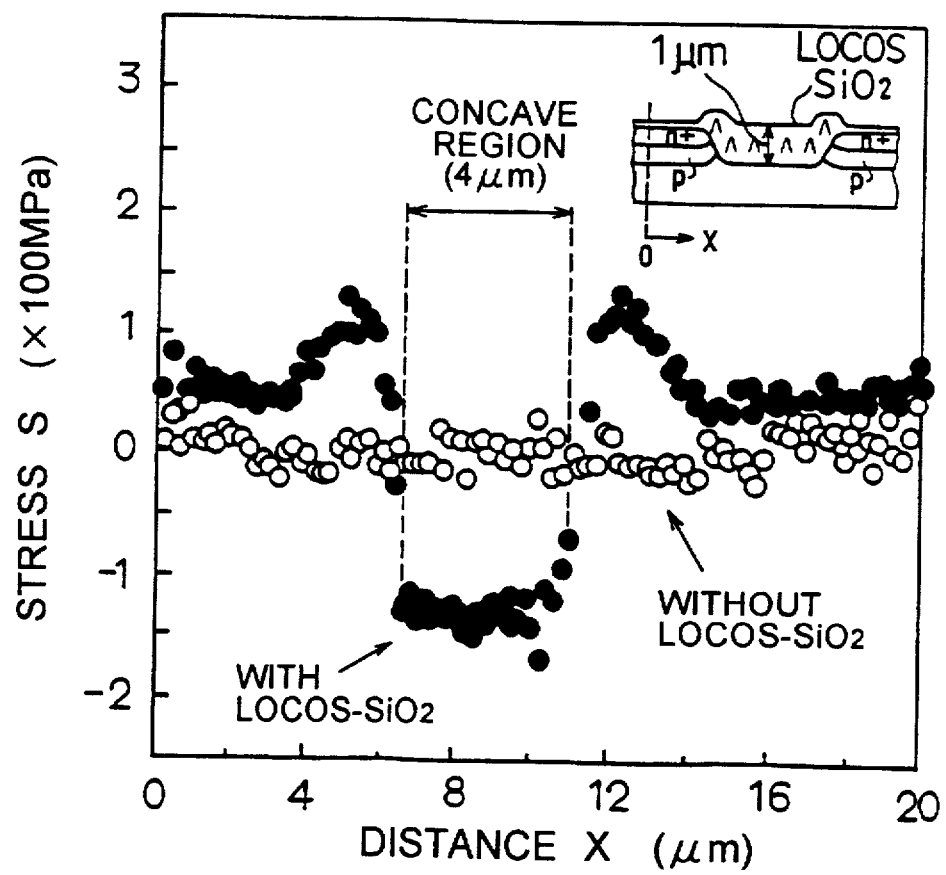
FIG. 24 is a graph showing the stress distribution in silicon along the concave surface.

FIG. 24 shows stress distribution in silicon along the concave surface with the LOCOS oxide film in comparison with a case without the LOCOS oxide film. The formed LOCOS oxide film is 1.0 µm in thickness, the concave depth is 0.9 µm, and the concave width is 4 82 m. In this figure, the characteristic represented by symbols ● shows the stress distribution of the concave structure with the LOCOS oxide film, and the characteristic represented by symbols ○ shows the stress distribution of the concave structure after removing the LOCOS oxide film. As understood from FIG. 24, the LOCOS oxide film induces the stress of ±150 MPa. The LOCOS-induced stress is observed as tensile stress at the bottom of the concavity and compressive stress adjacent to the concavity. On the contrary, stress is very low after removing the LOCOS oxide film. Consequently, it is evident that removal of the LOCOS oxide film is very effective in relaxation of the LOCOS-induced stress.

Residual stress distributions in silicon along the concave surface after forming the gate oxide film are shown in FIGS. 25A, 25B and 25C. FIGS. 25A, 25B and 25C show cases where the concave width b defined as shown in FIG. 26A are 2 µm, 4 µm and 5 µm, respectively. It is found from these figures that the greater the concave width b, the lower the residual stress. The residual stress is ¼–1/7 of the LOCOS induced stress of ±150 MPa.

As shown in FIGS. 25A, 25B and 25C, when the concave width b is reduced as 5 µm, 4 µm and 2 µm while keeping the concave depth D=0.9 µm, the residual stress increases as 40 MPa, 50 MPa and 70 MPa in response to the reduction of the concave width b. It is assumed from this result that, although it may depend on the thickness of the formed gate oxide film, in case the concave width b is further reduced, the residual stress increases markedly. If the residual stress becomes greater than 70 MPa, strain would be caused at the boundary portion (512 in FIG. 26A) between the sidewall surface 511 and the bottom wall surface, and thereby causing crystal defects. In order to avoid this, it is preferable that the concave width b should be set to be at least twice the concave depth D, or the concave depth D should be equal to or less than the half of the concave width b.

Accordingly, since the concave depth D is selected to be equal to or less than the half of the concave width b, strain is hardly caused at the boundary portion 512 between the sidewall surface 511 and the bottom wall surface when the gate oxide film is formed. Therefore, crystal defects due to the caused strain can be also prevented from occurring, and high channel mobility and low ON-resistance as well can be maintained.

Furthermore, as described above and shown in FIG. 26A, the concave structure has the flat sidewall surface 511 and the following lower dull corner part 512 smoothly connecting the sidewall surface 511 to the bottom wall of the concavity. Thus, the induced stress when the gate oxide film is formed can be suppressed by this lower dull corner part 512. As a result of this, crystal defects in the channel region due to the induced stress can be prevented from occurring at the time when the gate insulating film is formed, high channel mobility can be maintained, and a low ON-resistance can be obtained. Moreover, it is preferable that the upper dull corner part 513 should be provided to smoothly connect the flat sidewall surface 511 to the upper surface of the wafer.

Next, an actually fabricated example of the present invention will be described referring to the experimental result and the evaluation result obtained therefrom.

Figure 29:
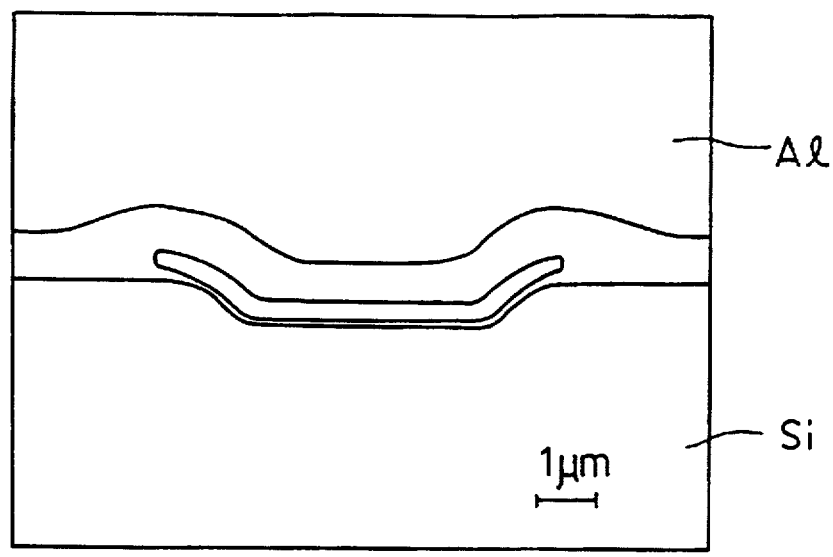
FIG. 29 is an illustrative view of SEM micrograph of a fabricated cross-sectional unit cell structure of the present invention.
Figure 30:
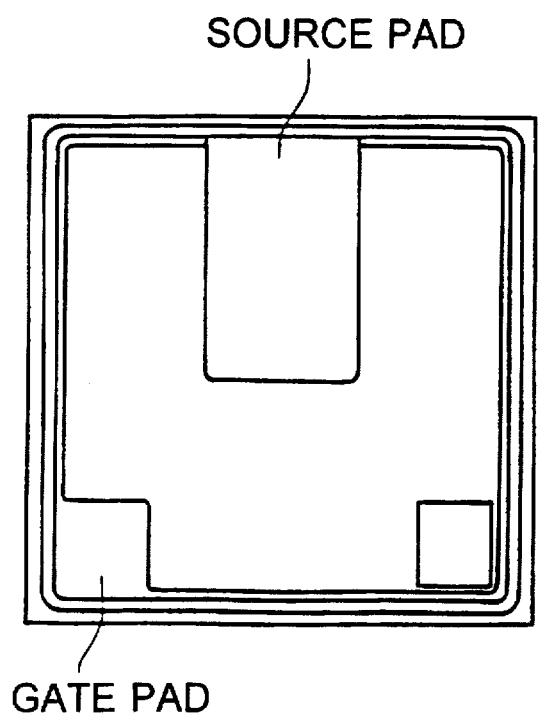
FIG. 30 is a plan view of the fabricated vertical power MOSFET chip.

FIG. 29 shows a cross-sectional view (illustrative view of SEM micrograph) of the fabricated 16 µm×16 µm square unit cell according to the actual example. The concave depth and width are 0.9 µm and 4 82 m, respectively. The sidewall surface of the concavity, which is a channel formation region, is oriented in (111). It is verified from the SEM micrograph that a gate oxide film of 60 nm in thickness uniformly covers the concave surface. FIG. 30 shows a plan view of the fabricated 2.5 mm×2.5 mm chip in which 13,135 unit cells, each cell having a configuration shown in FIG. 29, are integrated. The active area $S_A$ of the chip is 3.36 mm².

Figure 31:
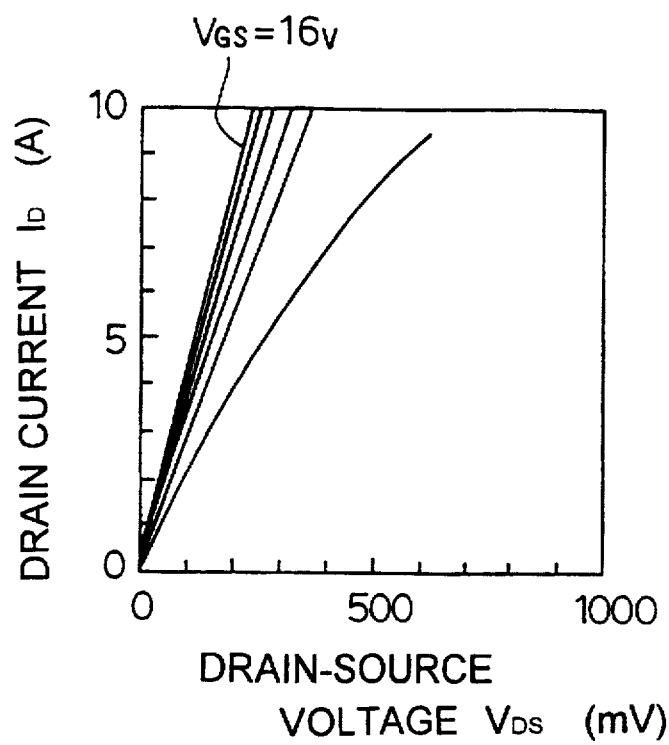
FIG. 31 is a graph showing the typical I-V characteristics of the fabricated vertical power MOSFET.
Figure 32:
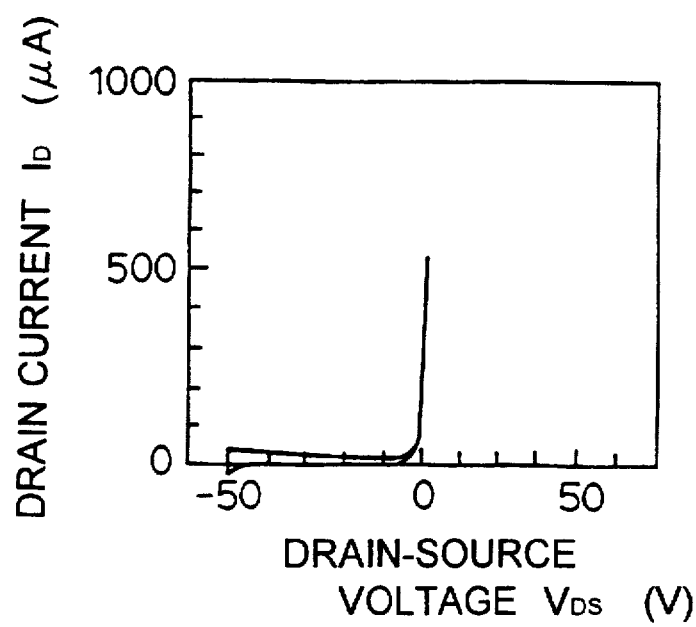
FIG. 32 is a graph showing the typical drain breakdown characteristics of the fabricated vertical power MOSFET.

FIG. 31 shows typical I-V characteristics of the fabricated chip. From the operating point of (115 mV, 5.17 A) on the line of the gate voltage $V_{GS}$=16 V in FIG. 31, specific ON-resistance was calculated as 75 mΩ·mm² by the equation; $(V_{DS}/I_D) \times S_A$. On the other h and , under the condition of $V_{GS}$=10 V, specific ON-resistance was calculated as 85 mΩ·mm². The threshold voltage was 1.2 V at 1 mA of drain current. Drain breakdown characteristics are shown in FIG. 32. The breakdown voltage is measured from FIG. 32 as 50 V.

Figure 33:
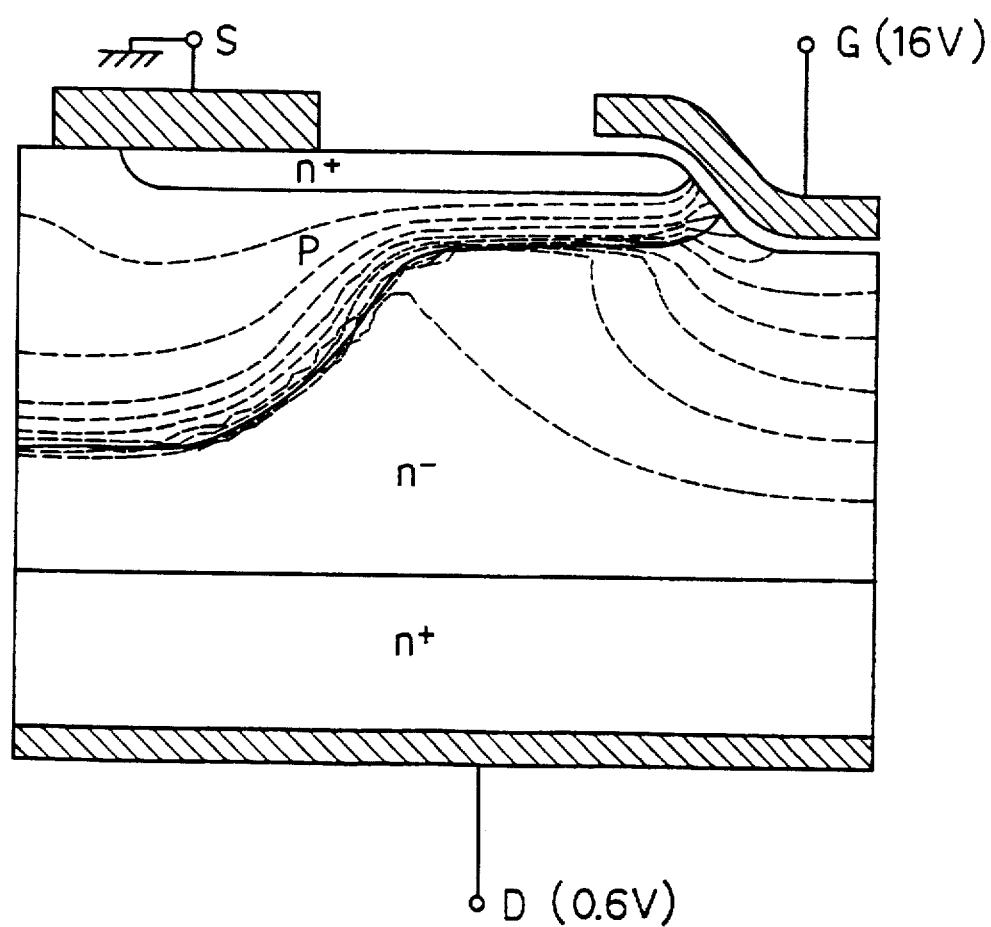
FIG. 33 is a diagram showing the simulated potential distribution (0.05 V steps) in the fabricated vertical power MOSFET.

FIG. 33 shows a simulation model of the fabricated 16 µm×16 µm square unit cell shown in FIG. 29 with a ON-state potential distribution under the conditions of the gate voltage $V_{GS}$=16 V and the drain voltage $V_{DS}$=0.6 V. In this figure, the channel length is 0.5 m and equipotential lines are depicted at every 0.05 V step. After the simulation, it was estimated that drain current $I_D$, breakdown voltage $BV_{DS}$ and threshold voltage $V_{TH}$ were 4.5×10⁻⁵ A/ µm, 52 V and 2.3 V, respectively. The simulated breakdown voltage $BV_{DS}$=52 V was almost equal to the experimental value of 50 V.

Also, from the simulated result of the drain current $I_D$=4.5×10⁻⁵ A/ µm and assumed cell perimeter/area of 20 cm/mm², specific ON-resistance was calculated as 66 mΩ·mm₂ which can be divided into a resistance component associated with a channel region ($r_{ch}$=23 mΩ·mm²), a resistance component associated with an accumulation region ($r_{acc}$=13 mΩ·mm²) and a resistance component associated with a drift region ($r_{drift}$=30 mΩ·mm²).

Next, an effective channel mobility obtained by the embodiment will be explained.

Figure 34:
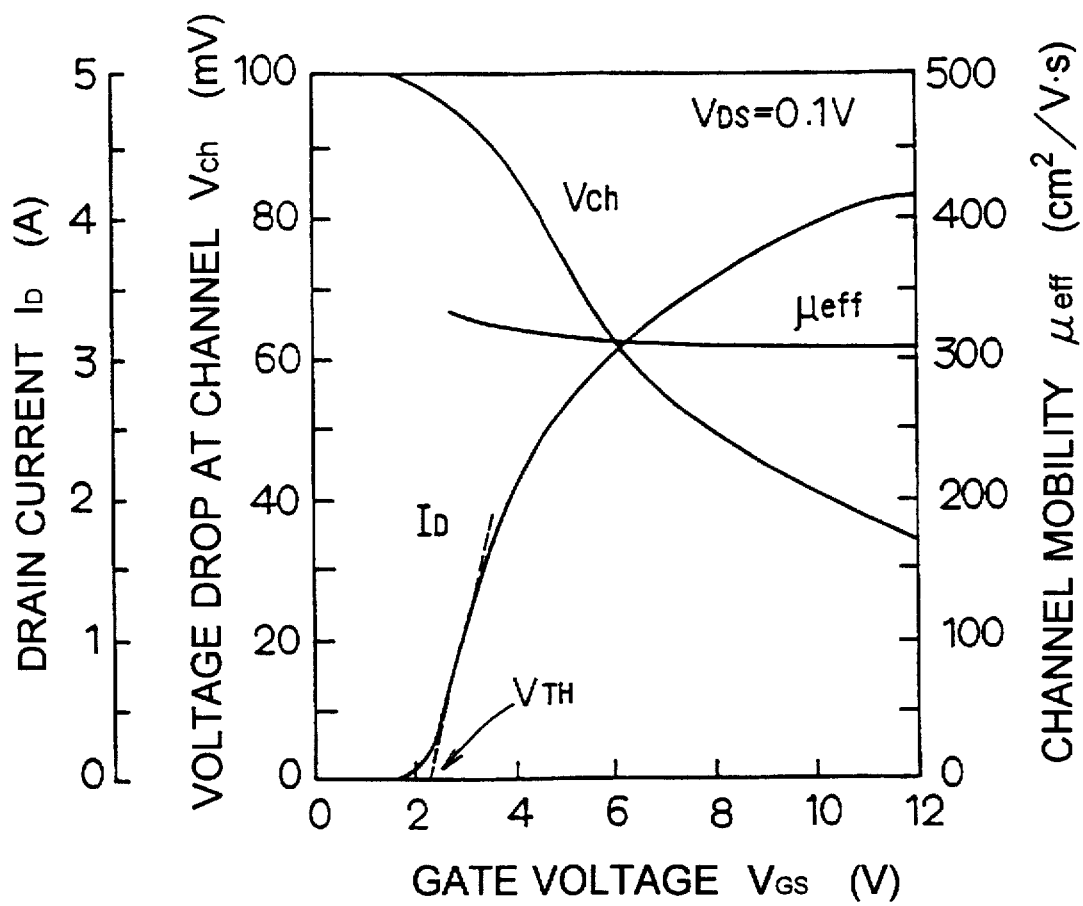
FIG. 34 is a graph showing characteristics of the drain current $I_D$, voltage drop $V_{ch}$ at channel, and the effective channel mobility $\mu_{eff}$ as functions of the gate voltage $V_{GS}$ of the fabricated vertical power MOSFET.

FIG. 34 shows characteristics of the experimental drain current $I_D$, voltage drop $V_{ch}$ at channel, and the effective channel mobility $\mu_{eff}$ as functions of the gate voltage $V_{GS}$ of the fabricated concave type DMOSFET of FIGS. 29 and 30. It is understood from this figure that the threshold voltage $V_{TH}$ is given by the tangential line to the $I_D$-$V_{GS}$ characteristics and is 2.3 V.

Figure 35:
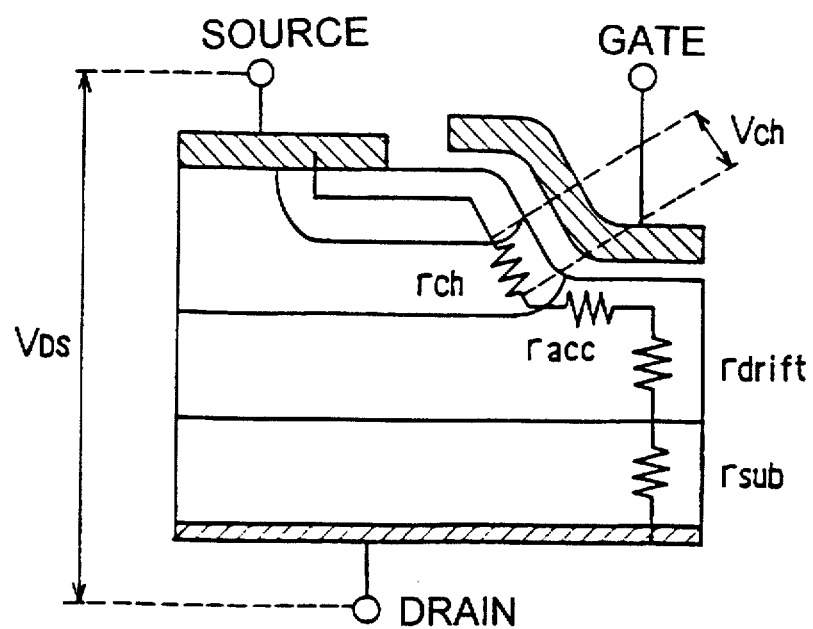
FIG. 35 is a view showing a schematic half-unit cell structure of the concave vertical power MOSFET with illustration of main components of the ON-resistance.

Herein, the voltage drop $V_{ch}$ at channel is defined as shown in FIG. 35 and is given by the following equation:

$$V_{ch}=V_{DS}-I_D\cdot(r_{acc}+r_{drift}+r_{sub}),$$

wherein $r_{sub}$ is a resistance component associated with the semiconductor substrate and, in this case, is assumed to be 10 mΩ·mm².

Using the above-mentioned simulated component resistances $r_{acc}$ and $r_{drift}$, $V_{ch}$-$V_{GS}$ curve is calculated and plotted in FIG. 34.

The effective channel mobility $\mu_{eff}$ is calculated by the following equation:

$$\mu_{eff}=(L/W)\cdot(t_{ox}/\epsilon_{ox})\cdot I_D/(V_{ch}\cdot(V_{GS}-V_{TH})),$$

wherein L and W are channel length and width, respectively, and $t_{ox}$ and $\epsilon_{ox}$ are gate oxide film thickness and dielectric constant thereof, respectively.

The calculated $\mu_{eff}$-$V_{GS}$ curve is also plotted in FIG. 34. As shown in FIG. 34, effective channel mobility higher than 300 cm²/V·s can be obtained.

As described above, it is also verified from the actually fabricated example that the channel mobility along (111) plane at the concavity is as high as that along (100) plane of the conventional planar-type DMOSFET.

Furthermore, the above-mentioned manufacturing process of the first embodiment has the advantages as follows.

Because the upper corner part of the initial groove 64 can be made to be nearly 90° by the isotropic chemical dry etching, the angle of inclination of the sidewall surface of the resultant U-groove 50 formed after the LOCOS oxidation can be made comparatively sharp near the upper dull corner part 513. This means that the cell size can be reduced and thereby low ON-state voltage can be obtained..

Besides the above, according to this embodiment, as the mask (silicon nitride film 63) used in the chemical dry etching process can be used as the oxidation mask for LOCOS oxidation process, there is no need to form a new mask or perform a mask alignment.

Furthermore, as the p-type body region 16 and the n⁺-type source region 4 are formed in self-alignment with the LOCOS oxide film 65, there is no alignment between the concave structure and the diffusion regions. Consequently, the body region 16 and the source region 4 can be formed in an exact position without an extra margin for alignment, the unit cell size can be reduced, and ON-resistance can be lowered.

Furthermore, each process for exposing the channel region, i.e., the LOCOS oxide film 65 removing process (FIG. 13) or the pad oxide film 600 removing process (FIG. 16), is performed while terminating dangling bonds on the surface of the n⁻-type epitaxial layer 2 with hydrogen within an aqueous solution. As a result of this, the highly reactive dangling bonds react to hydrogen into a stable state before reacting to the contaminant, whereby the reaction of the contaminant to the n⁻-type epitaxial layer 2 can be prevented. Subsequently, when the resultant wafer surface is exposed to the oxygen atmosphere, a more stable oxide film can be formed, whereby the surface of the U-groove 50 can be protected and the following contamination of the channel region can be prevented. By means of this, a high channel mobility can be obtained, and a low ON-state voltage can be realized.

Moreover, the removal of the formed oxide film 65 or 600 is performed within an aqueous solution including hydrofluoric acid, the selection ratio of the oxide film to be removed and the n⁻-type epitaxial layer 2 not to be removed can be set to be a very large, and the oxide film can be removed without damaging the surface of the n⁻-type epitaxial layer 2.

Further, by arranging the shading cloth 704 so that light is not irradiated onto the surface of the oxide film during the oxide film removal process, there is no light irradiated onto the semiconductor layer to be a channel region through the oxide film. Accordingly, as the electric potential of the n⁻-type source region 4 is almost equal to the electric potential of the p-type body region 16 both in the neighborhood of the channel region, the development of etching from a limited part can be prevented and a uniform etching is possible. As a result, a flat channel region can be obtained and a high mobility can be realized.

Here, as the index of plane of the sidewall surface of the U-groove 50 formed by removing the LOCOS oxide film 65 is (111), the silicon atoms of the sidewall surface can be terminated with a single piece of hydrogen and the sidewall surface can be flat in terms of atomic order, whereby a high channel mobility can be obtained. Furthermore, as the oxide film removal process is performed within an aqueous solution of pH4 or more, the possibility of terminating the silicon atoms of the sidewall surface of the U-groove 50 with a single piece of hydrogen can become higher and the flatness in terms of atomic order of the obtained (111) surface can be further improved, whereby a high channel mobility can be obtained.

Also in this embodiment, as illustrated in FIG. 20, the gate oxide film 8 at the part 501 in the neighborhood of the source region 4 with a low surface impurity concentration is the thin film part λ with a uniform in thickness. Therefore, when a voltage is applied to between the gate electrode 9 and the source electrode 19, as the electric field is not mitigated, electrons are accumulated on the surface thereof, the surface electron density increases and the resistance of the source region 4 decreases, whereby the ON-resistance can be reduced.

As the gate electrode end part is positioned on the thick film part x of the gate oxide film 8, the electric field is mitigated and the lifetime of the gate oxide film 8 can be extended.

Although only one embodiment of the present invention has been described with definite dimensions, it will be apparent that the present invention can be embodied in many other forms without departing from the spirit or the scope of the invention. For example, the thickness of the LOCOS oxide film or various diffusion depths of diffusion regions can be selected in accordance with the unit cell size to be fabricated. In case of forming a 12 μm×12 μm square unit cell, the thickness of the LOCOS oxide film is set to be, for example, approximately 0.7 μm while forming the p-type body region and n⁺-type source region with junction depths of approximately 0.9 μm and 0.4 μm, respectively.

The concave width may be set 0.5 μm or more. Also, it is preferable that the concave depth should be set between 0.5 μm and 5 μm. These dimensions are preferably selected in association with the miniaturization of unit cells to effectively obtain a low ON-resistance.

Furthermore, in the above embodiment, the silicon surface is protected by applying a natural oxide film by means of natural oxidation after removing the LOCOS oxide film within the aqueous solution containing hydrofluoric acid. This process, however, may be performed at a high temperature such as 900° C. A photoresist mask may be used for the formation of the n⁺-type source region and the p-type source region after removing the LOCOS oxide film. Furthermore, the plane orientation of the silicon substrate and the patterning shape may be selected so that the index of plane of the sidewall surface of the concavity can be (110) or (100).

Now, a manufacturing method for a semiconductor device which makes the plane orientation of the sidewall surface of the concavity to be a (110) plane will be described only as to those parts which are different from the first embodiment.

Figure 6:
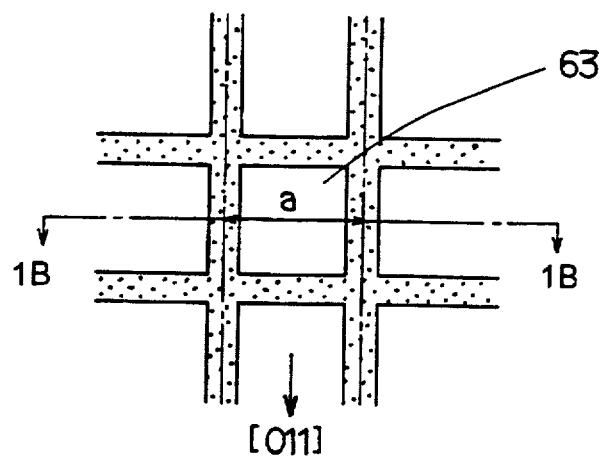
FIG. 6 is a plan view illustrating the manufacturing process of the important part of the vertical type power MOSFET of the first embodiment according to the present invention.

In the silicon nitride film patterning process illustrated in FIG. 6, the silicon nitride film 63 is patterned to be perpendicular and/or parallel to an orientation of <001> on the surface of the (100)-oriented silicon wafer and an open pattern is formed. Then, by using this silicon nitride film 63 as a mask, the chemical dry etching and the LOCOS oxidation are performed. In these processes, the conditions of the chemical dry etching and LOCOS oxidation are selected so that the sidewall angle θ (FIG. 8), which is an elevation angle of the sidewall surface of the concavity, is approximately 45.0°. By means of this, the resultant sidewall surface of the concavity can be controlled to be approximated to (110).

By making the sidewall surface of the concavity to be a (110) or (100) plane, high channel mobility can be obtained, and thereby low ON-resistance can be obtained.

In the above description, the (100)-oriented silicon substrate is used and the oxide resistant mask patterned at a right angle and parallel to an orientation <011> or <001> of the surface of the silicon substrate. However, even if this condition is deviated from the above, as long as the channel mobility and the interface state on the four planes of the sidewall surface of the concavity can be made symmetrical, the case can be included in the present invention.

Also, in the above embodiment, the lattice-like pattern is used for patterning at a right angle and parallel to an orientation of <011> or <001>. The present invention, however, should not be limited to the lattice-like pattern but a stripe-like pattern may also be used and the patterning may be at either a right angle or parallel to an orientation of <011> or <001>.

In the various embodiments, only the application of the present invention to a vertical type power MOSFET has been described. The present invention, however, may also be applied to a power MOS-IC with an incorporation of a vertical type power MOSFET. Furthermore, in the present embodiments, description has been given to a vertical type power MOSFET using an n⁺-type semiconductor substrate, but the present invention may also be applied to a gate construction of an IGBT (insulating gate type bipolar transistor) using a p₊-type semiconductor substrate.

In addition, the chemical dry etching process may be performed with a gas system which include one or more than one of $CCl_4$, $Cl_2$, $SF_6$, $CFCl_3$, $CF_2Cl_2$, $CF_3Cl$, $CHF_3$, $C_2ClF_5$, $F_2$, $NF_3$ and $BCl_3$, whereby the efficiency of this etching process can be increased.

Moreover, in the embodiments, chemical dry etching is performed without applying a voltage to the semiconductor substrate, but chemical dry etching may also be performed within the ionized gas atmosphere with a cathode drop on the upper part of the semiconductor layer of less than 10 V in absolute value. As a result of this chemical dry etching, it is not possible for the ionized gas to collide at a speed that may cause defects to the surface of the semiconductor layer, and the surface of the formed initial groove 64 can be a surface with few defects.

Furthermore, in the above embodiments, description has been given only to the n-channel type, it is needless to say that the p-channel type can have the same effect as the n-channel type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A manufacturing method of a vertical semiconductor device, comprising the steps of:

providing a first conductivity type semiconductor layer disposed on a semiconductor substrate;

forming a mask having an opening part within a specified region on a main surface of said first conductivity type semiconductor layer;

generating plasma within a plasma generation chamber containing an etching gas to form a chemically active etching gas, said plasma generation chamber being physically separated from a reaction chamber in which said semiconductor substrate and said semiconductor layer are disposed;

introducing said chemically active etching gas into said reaction chamber by transporting said chemically active gas from said plasma generation chamber to said reaction chamber via a passageway between said plasma generation chamber and said reaction chamber, said chemically active gas forming a first groove in said semiconductor layer by chemical dry etching said semiconductor layer through said opening part of said mask;

forming a local oxide film to a specified thickness from said main surface within said semiconductor layer within said specified region by locally oxidizing a region including said first groove so as to define a concave configuration in said locally oxidized region of said semiconductor layer due to erosion of said semiconductor layer in said locally oxidized region by said local oxide film, said concave configuration having a bottom surface and a sidewall surface not treater than 4 nm in a surface roughness;

introducing second conductivity type impurities from said main surface to form a second conductivity type body region within said semiconductor layer wherein a boundary of said second conductivity type body region is defined by said sidewall surface of said concave configuration;

introducing first conductivity type impurities into said second conductivity type body region from said main surface to form a first conductivity type source region within said second conductivity type body region, whereby a channel region is defined by said second conductivity type body region at said sidewall surface of said concave configuration between said semiconductor layer and said source region;

removing said local oxide film to expose said concave configuration;

forming a gate electrode along said sidewall surface of said concave configuration and at least over said channel region with a gate insulating layer interposed there between;

forming a source electrode electrically connected to at least said source region; and forming a drain electrode electrically connecting to said semiconductor substrate.

2. A method according to claim 1 wherein said local oxide film forming step includes forming said local oxide film so that said concave configuration has a width which is at least twice a depth thereof.

3. A method according to claim 2, wherein said width of said concave configuration is not less than 0.5 μm.

4. A method according to claim 2, wherein said depth of said concave configuration is selected to be between 0.5 μm and 5 μm.

5. A method according to claim 2, wherein said second conductivity type body region forming step includes forming said second conductivity type body region so as to have a junction depth not less than said depth of said concave configuration.

6. A method according to claim 1, wherein said chemical dry etching is an isotropic etching process.

7. A method according to claim 1, wherein said local oxide film forming step includes oxidizing said main surface of said semiconductor layer by using said mask formed in said mask forming step to form said local oxide film.

8. A method according to claim 1, wherein said body region forming step and said source region forming step are performed using said local oxide film as a diffusion mask.

9. A method according to claim 1, wherein said semiconductor layer is composed of silicon and said mask forming step includes forming said mask patterned to have said opening part extending at least along a <011> crystal axis of said semiconductor layer.

10. A method according to claim 9, wherein said local oxide film forming step includes forming said local oxide film so that said sidewall surface of said concave configuration is substantially oriented in (111) crystal plane.

11. A method according to claim 9, wherein said mask is patterned such that said opening part includes a first opening part extending along said <011> crystal axis and a second opening part extending along a direction perpendicular to said <011> crystal axis.

12. A method according to claim 1, wherein said semiconductor layer is composed of silicon and said local oxide film forming step includes forming said local oxide film so that said sidewall surface of said concave configuration is substantially oriented in either of (110) or (100) crystal plane.

* * * * *